(12) United States Patent
Žniderič et al.

(10) Patent No.: US 11,723,145 B2
(45) Date of Patent: Aug. 8, 2023

(54) PCB-MOUNTABLE SURGE PROTECTIVE DEVICE MODULES AND SPD CIRCUIT SYSTEMS AND METHODS INCLUDING SAME

(71) Applicant: RAYCAP IP DEVELOPMENT LTD, Nicosia (CY)

(72) Inventors: Tadej Žniderič, Kranj (SI); Marko Marčun, Križe (SI); Sebastjan Kamenšek, Škofja Loka (SI)

(73) Assignee: RAYCAP IP DEVELOPMENT LTD, Nicosia (CY)

( * ) Notice: Subject to any disclaimer, the term of this patent is extended or adjusted under 35 U.S.C. 154(b) by 0 days.

(21) Appl. No.: 17/479,356

(22) Filed: Sep. 20, 2021

(65) Prior Publication Data
US 2023/0093276 A1 Mar. 23, 2023

(51) Int. Cl.
*H02H 9/04* (2006.01)
*H05K 1/02* (2006.01)
(Continued)

(52) U.S. Cl.
CPC ........... *H05K 1/0257* (2013.01); *H02H 9/005* (2013.01); *H02H 9/04* (2013.01); *H05K 1/18* (2013.01); *H05K 2201/09063* (2013.01)

(58) Field of Classification Search
CPC .... H05K 1/0257; H05K 1/026; H05K 1/0268; H05K 1/0269; H05K 1/18;
(Continued)

(56) References Cited

U.S. PATENT DOCUMENTS

| 1,144,029 A | 6/1915 | Elmer |
| 2,158,859 A | 5/1939 | Horikoshi |

(Continued)

FOREIGN PATENT DOCUMENTS

| CH | 466427 A | 12/1968 |
| DE | 3111096 A1 | 9/1982 |

(Continued)

OTHER PUBLICATIONS

Beitz et al. "Dubbel Taschenbuch für den Maschinenbau" (3 pages) (1997).
(Continued)

*Primary Examiner* — Danny Nguyen
(74) *Attorney, Agent, or Firm* — Myers Bigel, P.A.

(57) ABSTRACT

A surge protective device (SPD) circuit system for providing overvoltage protection to an electrical power circuit includes a PCB assembly, an SPD module, and an SPD monitoring system. The PCB assembly selectively mountable on the PCB includes a PCB and a remote signal (RS) PCB contact on the PCB. The SPD module includes an overvoltage clamping element and an RS spring contact including an RS contact portion. When the SPD module is mounted on the PCB and the electrical power circuit is connected to the PCB: the PCB electrically connects the SPD module to the circuit and the overvoltage clamping element provides overvoltage protection to the circuit; the RS contact portion engages the RS PCB contact; the RS spring contact is elastically deflected and persistently loads the RS contact portion against the RS PCB contact; and the RS spring contact is electrically connected to the SPD monitoring system via the RS PCB contact.

26 Claims, 32 Drawing Sheets

(51) Int. Cl.
*H02H 9/00* (2006.01)
*H05K 1/18* (2006.01)

(58) Field of Classification Search
CPC ......... H05K 2201/09063; H02H 9/005; H02H 9/04; H01C 7/12; H01C 7/10; H01C 8/04
USPC .................................................. 361/117–119
See application file for complete search history.

(56) References Cited

U.S. PATENT DOCUMENTS

| | | |
|---|---|---|
| 2,311,758 A | 2/1943 | Johansson |
| 2,971,132 A | 2/1961 | Nash |
| 3,249,719 A | 5/1966 | Misare et al. |
| 3,375,405 A | 3/1968 | Chiffee et al. |
| 3,522,570 A | 8/1970 | Oley |
| 3,711,794 A | 1/1973 | Tasca et al. |
| 3,743,996 A | 7/1973 | Harnden |
| 3,813,577 A | 5/1974 | Kawiecke |
| 4,015,228 A | 3/1977 | Eda et al. |
| 4,023,133 A | 5/1977 | Knapp |
| 4,085,397 A | 4/1978 | Charles |
| 4,092,694 A | 5/1978 | Stetson |
| 4,217,618 A | 8/1980 | Kellenbenz et al. |
| 4,240,124 A | 12/1980 | Westrom |
| 4,241,374 A | 12/1980 | Gilberts |
| 4,249,224 A | 2/1981 | Baumbach |
| 4,288,833 A | 9/1981 | Howell |
| 4,355,345 A | 10/1982 | Franchet |
| 4,425,017 A | 1/1984 | Chan |
| 4,493,003 A | 1/1985 | Mickelson et al. |
| 4,571,656 A | 2/1986 | Ruckman |
| 4,595,635 A | 6/1986 | Dubrow et al. |
| 4,600,261 A | 7/1986 | Debbaut |
| 4,638,284 A | 1/1987 | Levinson |
| 4,701,574 A | 10/1987 | Shimirak et al. |
| 4,906,963 A | 3/1990 | Ackermann et al. |
| 4,908,730 A | 3/1990 | Westrom |
| 4,956,696 A | 9/1990 | Hoppe et al. |
| 5,006,950 A | 4/1991 | Allina |
| 5,130,884 A | 7/1992 | Allina |
| 5,172,296 A | 12/1992 | Kaczmarek |
| 5,311,164 A | 5/1994 | Ikeda et al. |
| 5,519,564 A | 5/1996 | Carpenter |
| 5,523,916 A | 6/1996 | Kaczmarek |
| 5,529,508 A | 6/1996 | Chiotis et al. |
| 5,588,856 A | 12/1996 | Collins et al. |
| 5,621,599 A | 4/1997 | Larsen et al. |
| 5,652,690 A | 7/1997 | Mansfield et al. |
| 5,721,664 A | 2/1998 | Uken et al. |
| 5,724,221 A | 3/1998 | Law |
| 5,781,394 A | 7/1998 | Lorenz et al. |
| 5,808,850 A | 9/1998 | Carpenter |
| 5,936,824 A | 8/1999 | Carpenter |
| 5,990,778 A | 11/1999 | Struempler et al. |
| 6,038,119 A | 3/2000 | Atkins et al. |
| 6,094,128 A | 7/2000 | Bennett et al. |
| 6,172,865 B1 | 1/2001 | Boy et al. |
| 6,175,480 B1 | 1/2001 | Karmazyn |
| 6,222,433 B1 | 4/2001 | Ramakrishnan et al. |
| 6,226,166 B1 | 5/2001 | Gumley et al. |
| 6,430,019 B1 | 8/2002 | Martenson et al. |
| 6,430,020 B1 | 8/2002 | Atkins et al. |
| 6,459,559 B1 | 10/2002 | Christofersen |
| 6,535,369 B1 * | 3/2003 | Redding ................. H02H 3/05 361/111 |
| 6,556,402 B2 | 4/2003 | Kizis et al. |
| 6,614,640 B2 | 9/2003 | Richter et al. |
| 6,930,871 B2 | 8/2005 | Macanda |
| 7,433,169 B2 | 10/2008 | Kamel et al. |
| 7,558,041 B2 | 7/2009 | Lagnoux |
| 7,684,166 B2 | 3/2010 | Donati et al. |
| 7,738,231 B2 | 6/2010 | Lagnoux |
| 8,493,170 B2 | 7/2013 | Zauner et al. |
| 8,659,866 B2 | 2/2014 | Douglass et al. |
| 8,743,525 B2 | 6/2014 | Xepapas et al. |
| 9,170,279 B2 | 10/2015 | Bent et al. |
| 9,349,548 B2 | 5/2016 | Juricev |
| 9,355,763 B2 | 5/2016 | Xu |
| 9,570,260 B2 | 2/2017 | Yang et al. |
| 9,634,554 B2 | 4/2017 | Falk et al. |
| 9,906,017 B2 | 2/2018 | Tsovilis et al. |
| 10,679,814 B2 | 6/2020 | Vrhunc et al. |
| 2002/0018331 A1 | 2/2002 | Takahashi |
| 2002/0024792 A1 | 2/2002 | Cantagrel |
| 2003/0184926 A1 | 10/2003 | Wu et al. |
| 2004/0150937 A1 | 8/2004 | Bobert et al. |
| 2005/0231872 A1 | 10/2005 | Schimanski et al. |
| 2006/0245125 A1 | 11/2006 | Aszmus |
| 2006/0291127 A1 | 12/2006 | Kim et al. |
| 2007/0217106 A1 | 9/2007 | Lagnoux |
| 2008/0043395 A1 | 2/2008 | Donati et al. |
| 2008/0049370 A1 | 2/2008 | Adachi et al. |
| 2009/0302992 A1 | 12/2009 | Cernicka |
| 2011/0193674 A1 | 8/2011 | Zaeuner et al. |
| 2011/0248816 A1 | 10/2011 | Duval et al. |
| 2012/0050935 A1 | 3/2012 | Douglass et al. |
| 2012/0086539 A1 | 4/2012 | Duval et al. |
| 2012/0086540 A1 | 4/2012 | Duval et al. |
| 2012/0206848 A1 | 8/2012 | Gillespie et al. |
| 2012/0250205 A1 | 10/2012 | Pfitzer et al. |
| 2013/0038976 A1 | 2/2013 | Hagerty |
| 2013/0200986 A1 | 8/2013 | Koprivsek |
| 2013/0265685 A1 | 10/2013 | Zäuner et al. |
| 2013/0335869 A1 | 12/2013 | Kepapas et al. |
| 2014/0010704 A1 | 1/2014 | Ishida et al. |
| 2014/0092514 A1 | 4/2014 | Chen |
| 2014/0292472 A1 | 10/2014 | Qin et al. |
| 2014/0327990 A1 | 11/2014 | Juricev |
| 2015/0103462 A1 | 4/2015 | Depping |
| 2015/0107972 A1 | 4/2015 | Oh |
| 2015/0263442 A1 | 9/2015 | Bakatsias et al. |
| 2015/0270086 A1 | 9/2015 | Tsan-Chi |
| 2015/0280420 A1 | 10/2015 | Xiaomao |
| 2015/0349523 A1 | 12/2015 | Tsovilis et al. |
| 2016/0087520 A1 | 3/2016 | Falk et al. |
| 2016/0276821 A1 | 9/2016 | Politis et al. |
| 2017/0311462 A1 | 10/2017 | Kamensek et al. |
| 2018/0138698 A1 | 5/2018 | Tsovilis et al. |
| 2018/0151318 A1 | 5/2018 | Kamensek et al. |
| 2018/0183230 A1 | 6/2018 | Kostakis et al. |
| 2018/0183232 A1 | 6/2018 | Tavcar et al. |
| 2018/0254629 A1 * | 9/2018 | Gattis .................... H01C 7/126 |
| 2019/0080826 A1 | 3/2019 | Kamensek et al. |

FOREIGN PATENT DOCUMENTS

| | | |
|---|---|---|
| DE | 3428258 A1 | 2/1986 |
| DE | 4235329 A1 | 4/1994 |
| DE | 69201021 T2 | 2/1995 |
| DE | 4438593 A1 | 5/1996 |
| DE | 19823446 A1 | 11/1999 |
| DE | 19839422 A1 | 3/2000 |
| DE | 19843519 A1 | 4/2000 |
| DE | 202004006227 U1 | 9/2004 |
| DE | 10323220 | 12/2004 |
| DE | 102006003274 A1 | 7/2007 |
| DE | 202008004699 U1 | 6/2008 |
| DE | 102007014336 A1 | 10/2008 |
| DE | 102008017423 A1 | 10/2009 |
| DE | 102008026555 A1 | 12/2009 |
| DE | 102012004678 A1 | 9/2013 |
| DE | 202006021210 U1 | 9/2013 |
| DE | 102013103753 A1 | 10/2013 |
| DE | 102013011216 B3 | 10/2014 |
| DE | 102013107807 B3 | 1/2015 |
| DE | 102013021936 B3 | 2/2015 |
| DE | 102014016938 B3 | 2/2016 |
| DE | 102014016830 A1 | 3/2016 |
| DE | 102007030653 B4 | 4/2017 |
| EP | 0108518 A2 | 5/1984 |
| EP | 0203737 A2 | 12/1986 |
| EP | 0335479 A2 | 10/1989 |
| EP | 0445054 A1 | 9/1991 |

(56) References Cited

FOREIGN PATENT DOCUMENTS

| | | |
|---|---|---|
| EP | 0462694 A2 | 12/1991 |
| EP | 0516416 A1 | 12/1992 |
| EP | 0603428 A1 | 6/1994 |
| EP | 0785625 A2 | 7/1997 |
| EP | 0963590 A1 | 12/1999 |
| EP | 1094550 A2 | 4/2001 |
| EP | 1102371 A1 | 5/2001 |
| EP | 1116246 A1 | 7/2001 |
| EP | 1355327 A2 | 10/2003 |
| EP | 1458072 A1 | 9/2004 |
| EP | 1798742 A1 | 6/2007 |
| EP | 2075811 A2 | 7/2009 |
| EP | 2707892 A1 | 3/2014 |
| EP | 2725588 A1 | 4/2014 |
| EP | 2953142 A1 | 12/2015 |
| EP | 3001525 A1 | 3/2016 |
| EP | 2954538 B1 | 9/2016 |
| EP | 3240132 A1 | 11/2017 |
| FR | 2574589 A1 | 6/1986 |
| FR | 2622047 A1 | 4/1989 |
| FR | 2897231 A1 | 8/2007 |
| JP | 60-187002 A | 9/1985 |
| JP | 60226103 A | 11/1985 |
| JP | 60258905 A | 12/1985 |
| JP | 61-198701 A | 9/1986 |
| JP | 1176687 A | 7/1989 |
| JP | H05176445 A | 7/1993 |
| JP | 09-326546 | 12/1997 |
| JP | 2002525861 A | 8/2002 |
| JP | 2002525862 A | 8/2002 |
| SI | 9700277 A | 4/1999 |
| SI | 9700332 A | 6/1999 |
| SI | 20781 A | 6/2002 |
| SI | 20782 A | 6/2002 |
| SI | 22030 A | 10/2006 |
| SI | 23303 A | 8/2011 |
| SI | 23749 A | 11/2012 |
| SI | 24371 A | 11/2014 |
| WO | 8800603 A2 | 1/1988 |
| WO | 9005401 A1 | 5/1990 |
| WO | 9515600 A1 | 6/1995 |
| WO | 9524756 A1 | 9/1995 |
| WO | 9742693 A1 | 11/1997 |
| WO | 9838653 A1 | 9/1998 |
| WO | 0017892 A1 | 3/2000 |
| WO | 2007117163 A1 | 10/2007 |
| WO | 2008009507 A1 | 1/2008 |
| WO | 2008104824 A1 | 9/2008 |
| WO | 2011102811 A2 | 8/2011 |
| WO | 2012026888 A1 | 3/2012 |
| WO | 2012027193 A1 | 3/2012 |
| WO | 2012154134 A1 | 11/2012 |
| WO | 2013044961 A1 | 4/2013 |
| WO | 2014161033 A1 | 10/2014 |
| WO | 2016101776 A1 | 6/2016 |
| WO | 2016110360 A1 | 7/2016 |

OTHER PUBLICATIONS

Data Book Library 1997 Passive Components, Siemens Matsushita Components pp. 15-17, 26-32, 36-37, 39, 161, 166, 167, 169, 171-174 (1997).

FormexTM GK/Formex Product Data Flame Retardant Polypropylene Sheet, ITW Formex (4 pages) (2002).

Oberg et al. "Machinery's Handbook 27th Edition—Soldering and Brazing" (4 pages) (2004).

Raycap "RayvossTM Transient Voltage Surge Suppression System" webpage, http://www.raycap.com/surge/rayvoss.htm accessed on Nov. 29, 2005 (1 page) (Date Unknown; Admitted Prior Art).

Raycap "Revolutionary Lightning Protection Technology" Raycap Corporation Press Release, webpage, http://www.raycap.com/news/020930.htm accessed on Nov. 29, 2005 (1 page) (Date Unknown; Admitted Prior Art).

Raycap "Strikesorb® 30 Series OEM Surge Suppression Solutions" brochure (2 pages) (Apr. 17, 2009).

Raycap "The Next Generation Surge Protection Rayvoss™" brochure (4 pages) (May 4, 2012).

Raycap "The Ultimate Overvoltage Protection Rayvoss™" brochure (4 pages) (2005).

Raycap "The Ultimate Overvoltage Protection Rayvoss™" brochure (4 pages) (Jan. 2009).

RayvossTM "The Ultimate Overvoltage Protection" webpage, http://www.rayvoss.com accessed on Nov. 29, 2005 (2 pages) (Date Unknown; Admitted Prior Art).

RayvossTM "Applications" webpage http://www.rayvoss.com/applications.htm accessed on Nov. 29, 2005 (4 pages) (undated).

RayvossTM "Frequently Asked Questions" webpage, http://www.rayvoss.com/faq.htm accessed on Nov. 29, 2005 (2 pages) (Date Unknown; Admitted Prior Art).

RayvossTM "Technical Information" webpage, http://www.rayvoss.com/tech_info.htm accessed on Nov. 29, 2005 (3 pages) (Date Unknown; Admitted Prior Art).

Translation of DIN-Standards, Built-In Equipment for Electrical Installations; Overall Dimensions and Related Mounting Dimensions (15 pages) (Dec. 1988).

VAL-MS-T1/T2 335/12.5/3+1, Extract from the online catalog, Phoenix Contact GmbH & Co. KG, http://catalog.phoenixcontact.net/phoenix/treeViewClick.do?UID=2800184 (7 pages) (May 22, 2014).

Extended European Search Report Corresponding to European Application No. 22196643.5 (8 pages) (dated Feb. 13, 2023).

* cited by examiner

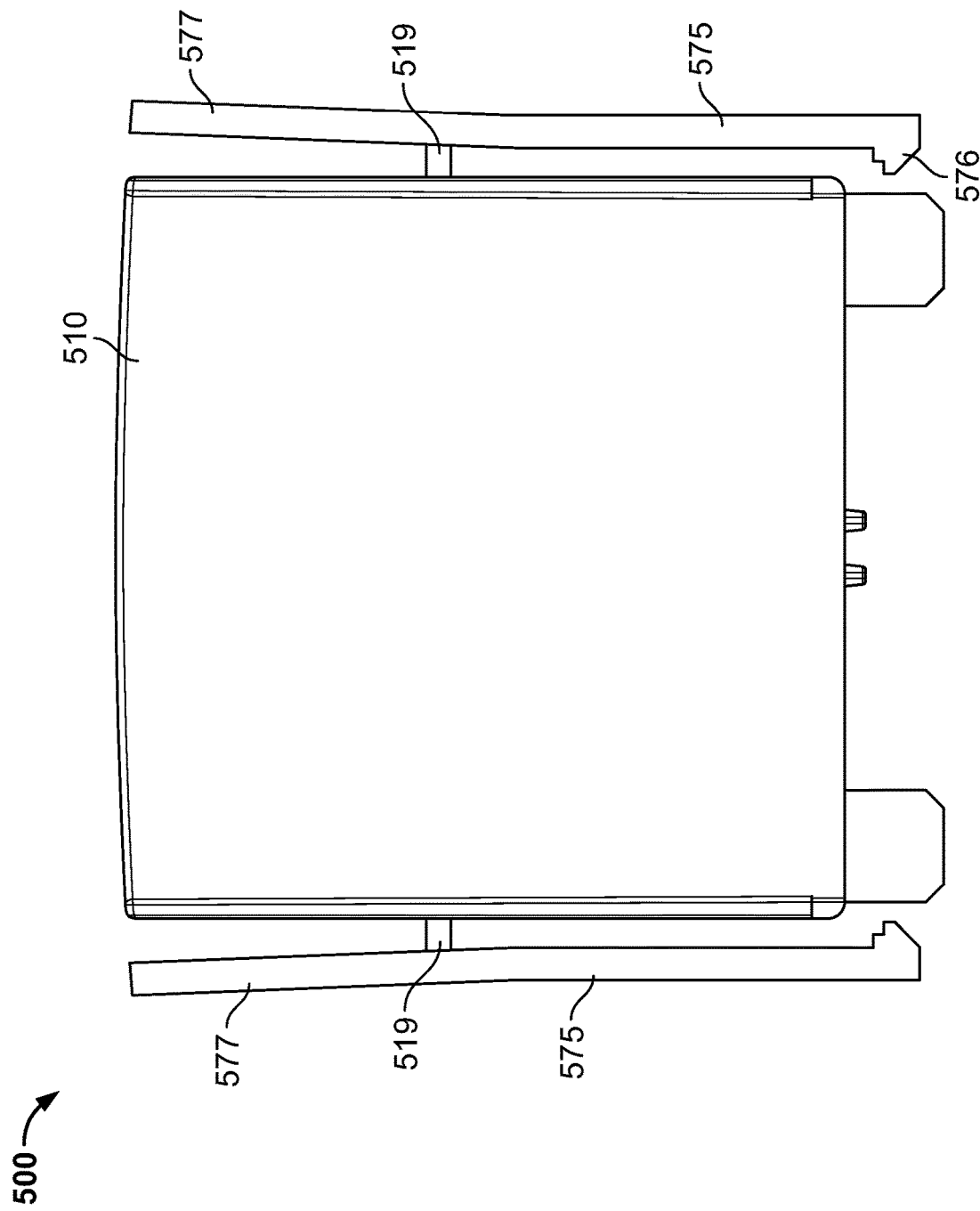

PCB-MOUNTABLE SURGE PROTECTIVE DEVICE MODULES AND SPD CIRCUIT SYSTEMS AND METHODS INCLUDING SAME

FIELD OF THE INVENTION

The present invention relates to surge protective devices and, more particularly, to surge protective device modules with remote indicator connectors.

BACKGROUND OF THE INVENTION

Frequently, excessive voltage or current is applied across service lines that deliver power to residences and commercial and institutional facilities. Such excess voltage or current spikes (transient overvoltages and surge currents) may result from lightning strikes, for example. The above events may be of particular concern in telecommunications distribution centers, hospitals and other facilities where equipment damage caused by overvoltages and/or current surges is not acceptable and resulting down time may be very costly.

Typically, sensitive electronic equipment may be protected against transient overvoltages and surge currents using surge protective devices (SPDs). For example, an overvoltage protection device may be installed at a power input of equipment to be protected, which is typically protected against overcurrents when it fails. Typical failure mode of an SPD is a short circuit. The overcurrent protection typically employed is a combination of an internal thermal disconnector to protect the device from overheating due to increased leakage currents and an external fuse to protect the device from higher fault currents. Different SPD technologies may avoid the use of the internal thermal disconnector because, in the event of failure, they change their operation mode to a low ohmic resistance.

In the event of a surge current in a line L (e.g., a voltage line of a three phase electrical power circuit), protection of power system load devices may necessitate providing a current path to ground for the excess current of the surge current. The surge current may generate a transient overvoltage between the line L and the neutral line N (the neutral line N may be conductively coupled to a protective earth ground PE). Because the transient overvoltage significantly exceeds the operating voltage of the SPD, the SPD may become conductive, allowing the excess current to flow from line L through the SPD to the neutral line N. Once the surge current has been conducted to the neutral line N, the overvoltage condition ends and the SPD may become non-conducting again.

SUMMARY OF THE INVENTION

According to a first aspect, a surge protective device (SPD) circuit system for providing overvoltage protection to an electrical power circuit includes a printed circuit board (PCB) assembly, an SPD module, and an SPD monitoring system. The PCB assembly includes a PCB and a remote signal (RS) PCB contact on the PCB. The SPD module is selectively mountable on the PCB. The SPD module includes an overvoltage clamping element and an RS spring contact. The RS spring contact includes an RS contact portion. When the SPD module is mounted on the PCB and the electrical power circuit is connected to the PCB: the PCB electrically connects the SPD module to the electrical power circuit and the overvoltage clamping element provides overvoltage protection to the electrical power circuit; the RS contact portion engages the RS PCB contact; the RS spring contact is elastically deflected and persistently loads the RS contact portion against the RS PCB contact; and the RS spring contact is electrically connected to the SPD monitoring system via the RS PCB contact.

In some embodiments, the PCB assembly includes a second RS PCB contact on the PCB, the SPD module includes a second RS spring contact, the second RS spring contact including a second RS contact portion, and when the SPD module is mounted on the PCB and the electrical power circuit is connected to the PCB: the second RS contact portion engages the second RS PCB contact; the second RS spring contact is elastically deflected and persistently loads the second RS contact portion against the second RS PCB contact; and the second RS spring contact is electrically connected to the SPD monitoring system via the second RS PCB contact.

According to some embodiments, the RS PCB contact is an electrically conductive contact layer forming a part of the PCB.

In some embodiments, the RS PCB contact is an electrically conductive PCB contact pad forming a part of the PCB.

According to some embodiments, the RS PCB contact is an electrically conductive plated through hole forming a part of the PCB.

In some embodiments, the PCB assembly includes first and second electrical power contacts on the PCB, the SPD module includes first and second electrical power terminals, the overvoltage clamping element is connected between the first and second electrical power terminals, and the first and second electrical power terminals are configured to engage the first and second electrical power contacts, respectively, and thereby electrically connect the first and second electrical power contacts to the overvoltage clamping element.

The overvoltage clamping element may include a varistor.

In some embodiments, the SPD module includes a module housing enclosing the overvoltage clamping element and supporting the RS spring contact.

According to some embodiments, the PCB assembly includes stabilizer slots defined in the substrate, and the SPD module includes stabilizer tabs configured to be received in the stabilizer slots when the SPD module is mounted on the PCB.

The SPD circuit system may include a locking mechanism configured to mechanically and releasably secure the SPD module to the PCB when the SPD module is mounted on the PCB.

According to some embodiments, the locking mechanism includes: a locking slot defined in the substrate, and a displaceable locking tab forming a part of the SPD module. The locking tab is configured to interlock with the locking slot when the SPD module is mounted on the PCB to secure the SPD module to the PCB.

In some embodiments, the SPD module includes a module housing enclosing the overvoltage clamping element and supporting the RS spring contact, and a locking member including the locking tab and removably coupled to the module housing.

The SPD module may include a release mechanism operable to release the locking tab from the locking slot.

In some embodiments, the locking mechanism includes a locking slot defined in the substrate, and a locking member forming a part of the SPD module, the locking member including a latch feature. The locking member is rotatable between a locked position, to interlock the latch feature with the locking slot, and an unlocked position, to release the latch feature from the locking slot, when the SPD module is mounted on the PCB.

According to some embodiments, the SPD module includes a module condition indicator mechanism, and the SPD monitoring system is configured to detect a state of the module condition indicator mechanism via the RS PCB contact.

In some embodiments, the module condition indicator mechanism includes a switch.

According to some embodiments: the PCB assembly includes first and second electrical power contacts on the PCB; the SPD module includes first and second electrical power terminals; the overvoltage clamping element is connected between the first and second electrical power terminals; the first and second electrical power terminals are configured to engage the first and second electrical power contacts, respectively, and thereby electrically connect the first and second electrical power contacts to the overvoltage clamping element; the module condition indicator mechanism includes a thermal disconnector mechanism; and the thermal disconnector mechanism is configured to electrically disconnect the first electrical power terminal from the second electrical power terminal responsive to a thermal event in the SPD module.

In some embodiments, the module condition indicator mechanism includes a switch, and the thermal disconnector mechanism is configured to change a state of the switch responsive to a thermal event in the SPD module.

According to some embodiments, the SPD module includes a local alert mechanism, and the thermal disconnector mechanism is configured to actuate the local alert mechanism responsive to a thermal event in the SPD module.

According to some embodiments, the SPD monitoring system is configured to issue an alarm responsive to the SPD monitoring system detecting a failure of the SPD module via the RS PCB contact.

According to some embodiments: the PCB assembly includes a second RS PCB contact on the PCB; the SPD module includes a second RS spring contact, the second RS spring contact including a second RS contact portion; when the SPD module is mounted on the PCB and the electrical power circuit is connected to the PCB: the second RS contact portion engages the second RS PCB contact; the second RS spring contact is elastically deflected and persistently loads the second RS contact portion against the second RS PCB contact; and the second RS spring contact is electrically connected to the SPD monitoring system via the second RS PCB contact; the PCB assembly includes first and second electrical power contacts on the PCB; the SPD module includes first and second electrical power terminals; the overvoltage clamping element is connected between the first and second electrical power terminals; the first and second electrical power terminals are configured to engage the first and second electrical power contacts, respectively, and thereby electrically connect the first and second electrical power contacts to the overvoltage clamping element; the overvoltage clamping element includes a varistor; the SPD module includes a module condition indicator mechanism; the SPD monitoring system is configured to detect a state of the module condition indicator mechanism via the RS PCB contact; the module condition indicator mechanism includes a thermal disconnector mechanism; the thermal disconnector mechanism is configured to electrically disconnect the first electrical power terminal from the second electrical power terminal responsive to a thermal event in the SPD module; the SPD module includes a module housing enclosing the overvoltage clamping element and the thermal disconnector mechanism, and supporting the RS spring contact; and the SPD circuit system includes a locking mechanism configured to mechanically and releasably secure the SPD module to the PCB when the SPD module is mounted on the PCB.

According to a second aspect, a method for providing overvoltage protection to an electrical power circuit includes providing a surge protective device (SPD) circuit system. The SPD circuit system includes a printed circuit board (PCB) assembly, an SPD module, and an SPD monitoring system. The PCB assembly includes a PCB, and a remote signal (RS) PCB contact on the PCB. The SPD module is selectively mountable on the PCB. The SPD module includes an overvoltage clamping element, and an RS spring contact. The RS spring contact includes an RS contact portion. The SPD monitoring system is electrically connected to the RS PCB contact. The method further includes: mounting the SPD module on the PCB; and connecting the electrical power circuit to the PCB. The PCB electrically connects the SPD module to the electrical power circuit and the overvoltage clamping element provides overvoltage protection to the electrical power circuit. The RS contact portion engages the RS PCB contact.

The RS spring contact is elastically deflected and persistently loads the RS contact portion against the RS PCB contact. The RS spring contact is electrically connected to the SPD monitoring system via the RS PCB contact.

According to a third aspect, a surge protective device (SPD) module for use with a printed circuit board (PCB) assembly and an SPD monitoring system for providing overvoltage protection to an electrical power circuit, the PCB assembly including a PCB and a remote signal (RS) PCB contact on the PCB, includes an overvoltage clamping element, and an RS spring contact. The RS spring contact includes an RS contact portion. The SPD module is selectively mountable on the PCB such that: the RS contact portion engages the RS PCB contact; the RS spring contact is elastically deflected and persistently loads the RS contact portion against the RS PCB contact; and the RS spring contact is electrically connected to the SPD monitoring system via the RS PCB contact.

BRIEF DESCRIPTION OF THE DRAWINGS

FIG. 32 is a side view of an SPD module according to further embodiments.

DESCRIPTION

Figure 1:
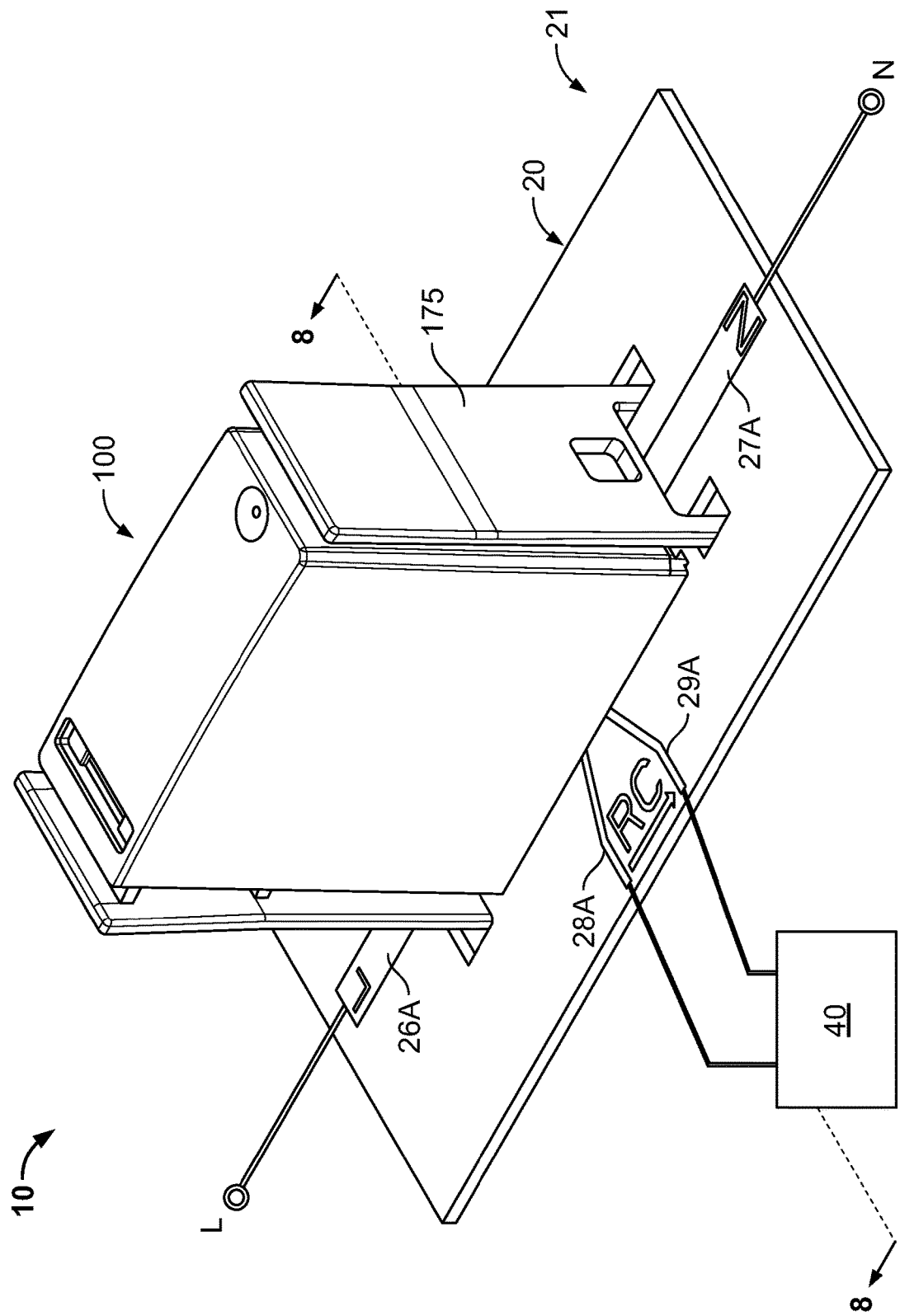
FIG. 1 is a top perspective view of an SPD circuit system according to some embodiments.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term a data processing system may include, but it is not limited to, a hardware element, firmware component, and/or software component.

As used herein, "monolithic" means an object that is a single, unitary piece formed or composed of a material without joints or seams. Alternatively, a unitary object can be a composition composed of multiple parts or components secured together at joints or seams.

Referring to FIGS. 1-17, a surge protective device (SPD) circuit network or system 10 according to some embodiments of the inventive concept is shown therein. The illustrative system 10 includes a printed circuit board (PCB) assembly 21, an SPD monitoring system 40, and an SPD module 100. The PCB assembly 21 includes a PCB 20 and an electrical circuit 24. The SPD module 100 is connected, via the PCB 20, to two lines of an electrical power circuit (e.g., between a phase line or neutral and ground/protected earth, or between a phase line L and a neutral line N) to provide overvoltage protection of the electrical power circuit. The SPD module 100 is also connected, via the PCB assembly 21, to the SPD monitoring system 40 to enable the SPD monitoring system 40 to monitor or detect a condition of the SPD module 100.

Although FIG. 1 illustrates an example surge protective device circuit network, it will be understood that embodiments of the inventive concept are not limited to such configurations, but are intended to encompass any configuration capable of carrying out the operations described herein.

The PCB 20 (FIGS. 1-4 and 7-10) includes a PCB substrate 22 and a plurality or pattern(s) of electrically conductive (e.g., copper) layers laminated to the substrate and embodied in the PCB 20, as is well known in the art. These electrically conductive layers may include electrically conductive traces, pads, vias, and/or plated through-holes, for example.

The PCB substrate 22 has front face 22A generally defining a PCB plane C. The PCB 20 has a receiving axis B-B substantially orthogonal to the PCB plane C.

A pair of locator or stabilizer slots 32 and a pair of locking slots 34 are defined in the PCB substrate 22.

At least a portion of the electrical circuit 24 is embodied in the PCB 20 on the PCB substrate 22. In some embodiments, the electrical circuit 24 is entirely embodied in the PCB 20. The electrical circuit 24 may include various electrical components and connections (e.g., electrical traces, etc.) that are formed in or mounted on the PCB 20, as is well known in the art.

In some embodiments, the PCB assembly 21 includes the PCB 20 and electronic components mounted on and electrically connected to or integrated with the PCB 20. In some embodiments, the PCB assembly 21 consists of only the PCB 20 (i.e., without electronic components mounted on and electrically connected to or integrated with the PCB 20).

The illustrative electrical circuit 24 includes electrically conductive (e.g., metal) power leads or traces 26A and 27A connected to electrically conductive (e.g., metal) through-hole power contacts 26 and 27, respectively. The through-hole contacts 26 and 27 are disposed in respective slots 30 defined in the PCB substrate 22. In some embodiments, the through-hole contacts 26 and 27 are plated in respective slots 30. The traces 26A, 27A and the contacts 26, 27 are formed in or on the PCB 20 as parts of the PCB 20.

The electrical circuit 24 also includes electrically conductive (e.g., metal) remote signal (RS) leads or traces 28A and 29A connected to electrically conductive (e.g., metal) RS PCB contacts or contact pads 28 and 29, respectively. The RS PCB contact pads 28 and 29 are disposed on the front face 22A of the PCB substrate 22 as exposed surface pads. The RS traces 28A and 29A are electrically connected to the SPD monitoring system 40. The traces 28A, 29A and the contacts 28, 29 are formed in or on the PCB 20 as parts of the PCB 20.

In alternative embodiments (not shown in the figures), other types of electrically conductive members or contacts that are not parts of the PCB 20 may be used in place of the contacts 28, 29. These alternative contacts members may include an electrically conductive (e.g., metal) pin or plate mounted on the substrate 22 in the same locations as shown for the contacts 28, 29, and electrically connected to the traces 28A, 29A or other electrical leads as described.

The SPD monitoring system 40 includes a circuit or device configured to suitably detect the state of the module condition indicator mechanism from the electrical connections at the RS PCB contact pads 28 and 29. In some embodiments, all or part of the SPD monitoring system 40 is located remotely from the PCB assembly 21 and is connected to PCB 20 to enable communication or signal transmission between the PCB assembly 21 and the SPD monitoring system 40 (e.g., via wired or wireless connection). For example, in some embodiments the SPD monitoring system 40 includes a monitoring circuit or device located in different cabinet, room, building, or facility than the PCB assembly 21. In other embodiments, the SPD monitoring system 40 includes a monitoring circuit or device integrated into the PCB assembly 21. The SPD monitoring system 40 may include a device configured to record or issue an alarm (e.g., visible or audible) in response to a signal corresponding to a change in state of the module 100.

The SPD module 100 (FIGS. 2 and 4-17) includes a module housing 110, a first RS connector 120, a second RS connector 122, an SPD clamping element subassembly 130, a thermal disconnector mechanism 140, a first power connector member 150, a second power connector member 154, and a module condition indicator mechanism 160. These components are each integral to the SPD module 100. The SPD module 100 has an insertion axis A-A.

The housing 110 (FIGS. 4 and 5) includes an inner housing member or frame 114 and an outer housing member or cover 112 collectively forming the housing 110. The housing 110 defines an internal chamber or cavity enclosing or containing the SPD clamping element subassembly 130, the thermal disconnector mechanism 140, and the module condition indicator mechanism 160.

A pair of integral locking arms or tabs 175 are flexibly cantilevered from the sidewalls of the cover 112. Each locking tab 175 has a pair of integral latch features 176 on its distal end.

Four fixed locator or stabilizer tabs 115 project rearwardly at the rear end of the cover 112.

A front indicator opening or window 112B is provided on a front wall of the cover 112. The indicator window 112B may serve to visually indicate a change in status of the module 100, as discussed below.

Power connection connector holes 117 and remote contact holes 118 are provided in the rear wall of the housing 110.

The housing 110 may be formed of any suitable material or materials. In some embodiments, the housing 110 is formed of a rigid polymeric material. Suitable polymeric materials may include polyamide (PA), polypropylene (PP), polyphenylene sulfide (PPS), or ABS, for example.

The SPD clamping element subassembly 130 may include one or more overvoltage clamping elements. In some embodiments, the overvoltage clamping element(s) includes one or more varistors. The SPD module 100 may further include a gas discharge tube (GDT) (not shown in the illustrated embodiment). The varistor(s) and the GDT may be viewed together as an overvoltage protection circuit.

While both GDTs and MOVs may be used in SPDs, such as the SPD module 100, both GDTs and MOVs have advantages and drawbacks in shunting current away from sensitive electronic components in response to overvoltage surge events. For example, MOVs may have the advantage of responding rapidly to surge events and being able to dissipate the power associated with surge events. But MOVs may have the disadvantages of having increased capacitance relative to GDTs and passing a leakage current therethrough even in ambient conditions. MOVs may also have a decreased lifetime expectancy relative to GDTs. GDTs may have the advantage of having extremely low to no leakage current, minimal capacitance, and an increased lifetime expectancy relative to MOVs. But GDTs may not be as responsive to surge events as MOVs. Moreover, when a GDT fires and transitions into the arc region in response to a surge event, the GDT may remain in a conductive state if the ambient voltage on the line to which the GDT is connected exceeds the arc voltage.

A GDT is a sealed device that contains a gas mixture trapped between two electrodes. The gas mixture becomes conductive after being ionized by a high voltage spike. This high voltage that causes the GDT to transition from a non-conducting, high impedance state to a conducting state is known as the sparkover voltage for the GDT. The sparkover voltage is commonly expressed in terms of a rate of rise in voltage over time. For example, a GDT may be rated so as to have a DC sparkover voltage of 500 V under a rate of rise of 100 V/s. When a GDT experiences an increase in voltage across its terminals that exceeds its sparkover voltage, the GDT will transition from the high impedance state to a state known as the glow region. The glow region refers to the time region where the gas in the GDT starts to ionize and the current flow through the GDT starts to increase. During the glow region, the current through the GDT will continue to increase until the GDT transitions into a virtual short circuit known as the arc region. The voltage developed across a GDT when in the arc region is known as the arc voltage and is typically less than 100 V. A GDT takes a relatively long time to trigger a transition from a high impedance state to the arc region state where it acts as a virtual short circuit. As a result, relatively high voltage transients may not be diverted to ground or other reference terminal and may be passed through to other circuitry.

A MOV when in a generally non-conductive state still conducts a relatively small amount of current caused by reverse leakage through diode junctions. This leakage current may generate a sufficient amount of heat that a device, such as a thermal disconnect mechanism, may be used to reduce the risk of damage to components of an SPD. When a transient overvoltage event occurs, an MOV may conduct little current until reaching a clamping voltage level at which point the MOV may act as a virtual short circuit. Typically, the clamping voltage is relatively high, e.g., several hundred volts, so that when an MOV passes a high current due to a transient over voltage event a relatively large amount of power may be dissipated.

Figure 5:
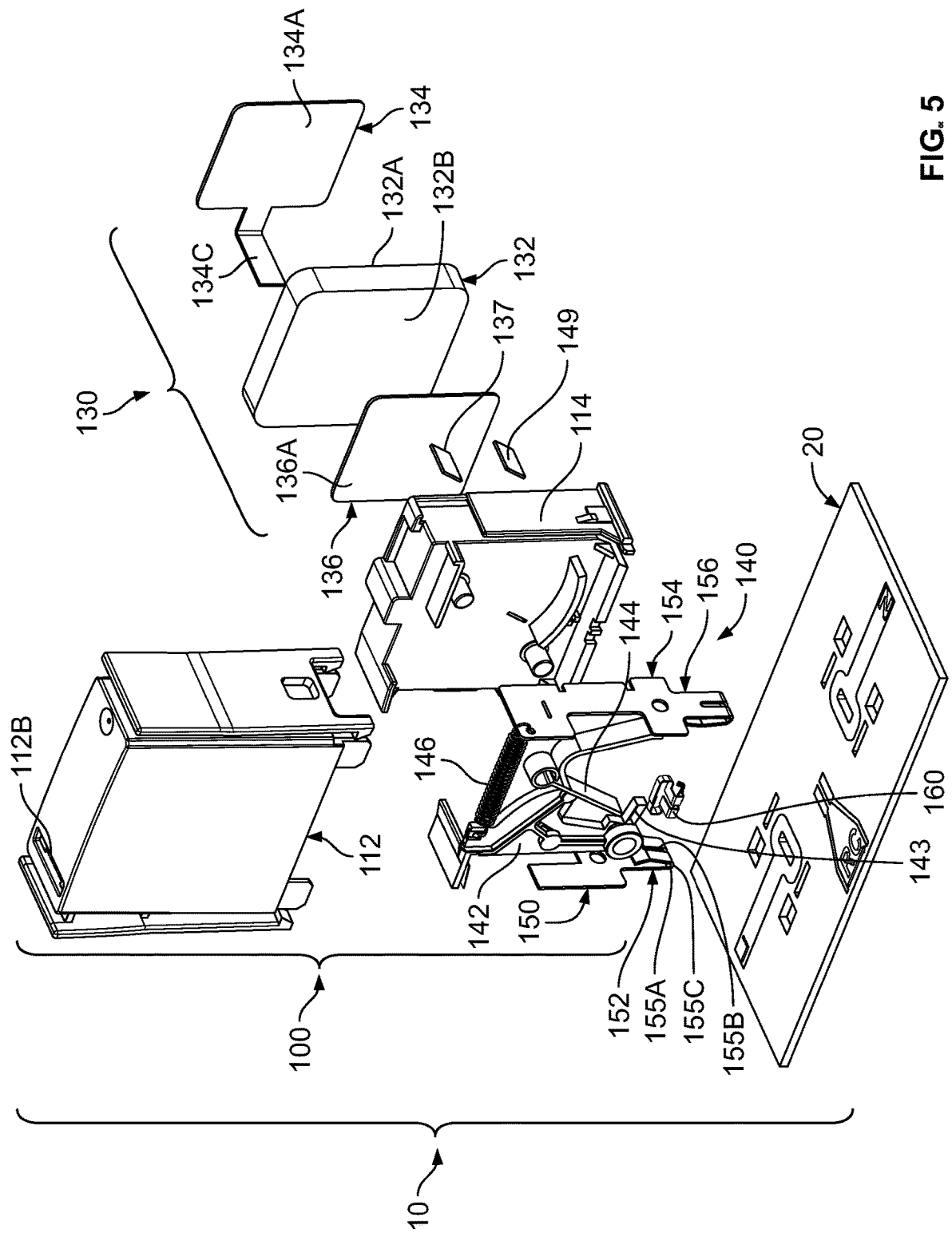
FIG. 5 is a more fully exploded, top perspective view of the SPD circuit system of FIG. 1.
Figure 6:
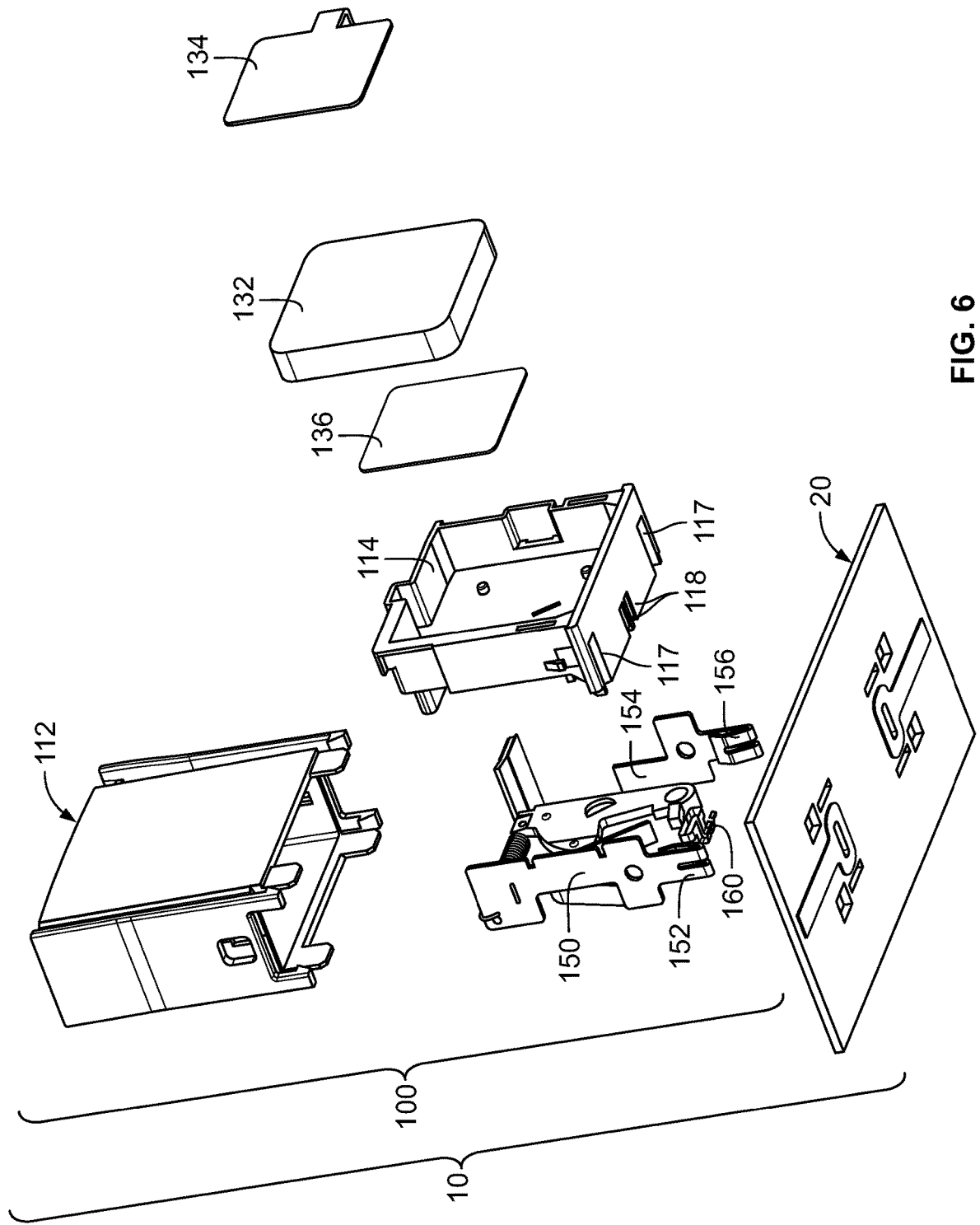
FIG. 6 is a more fully exploded, bottom perspective view of the SPD circuit system of FIG. 1.
Figure 7:
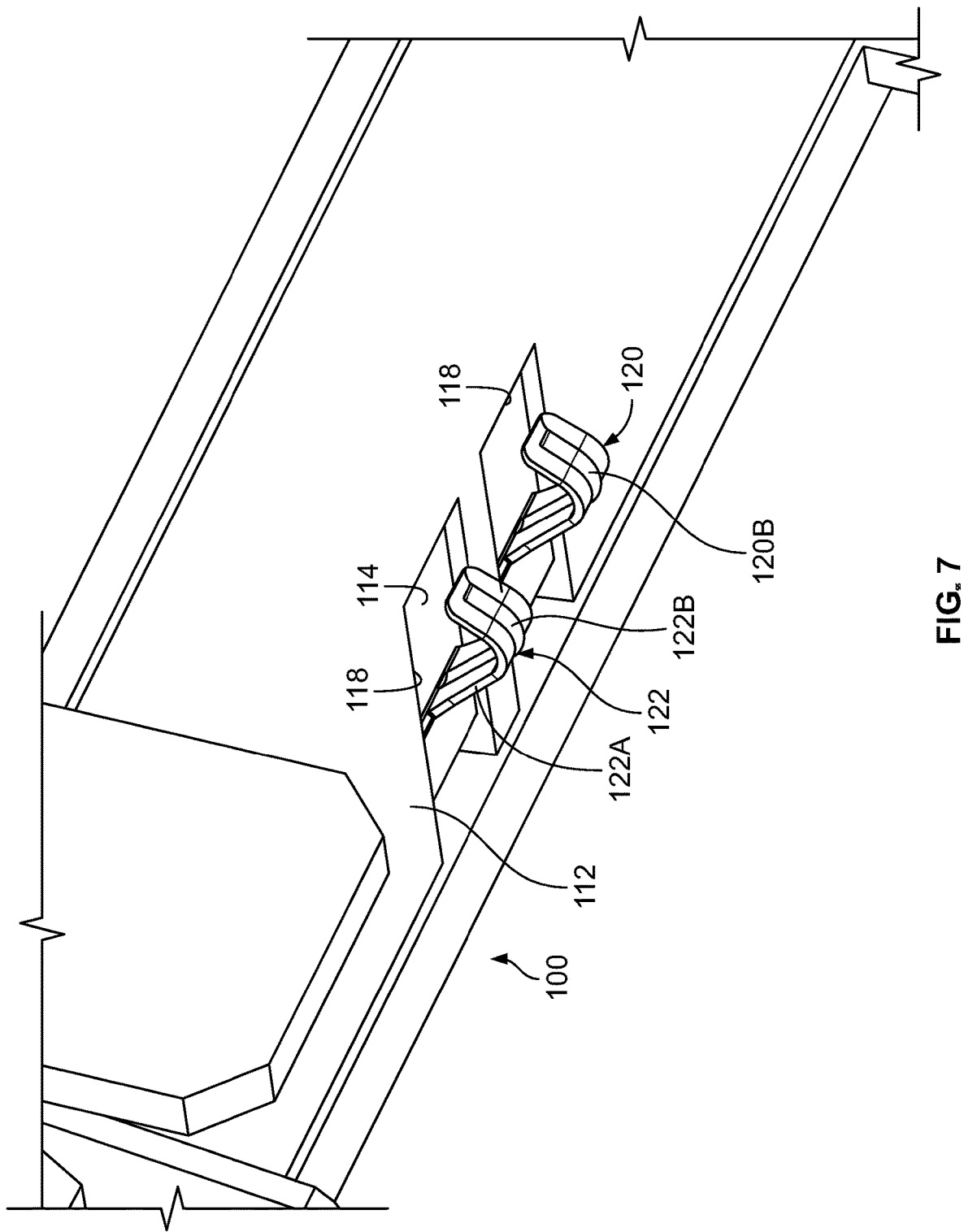
FIG. 7 is an enlarged, fragmentary, bottom perspective view of an SPD module forming a part of the SPD circuit system of FIG. 1.
Figure 8:
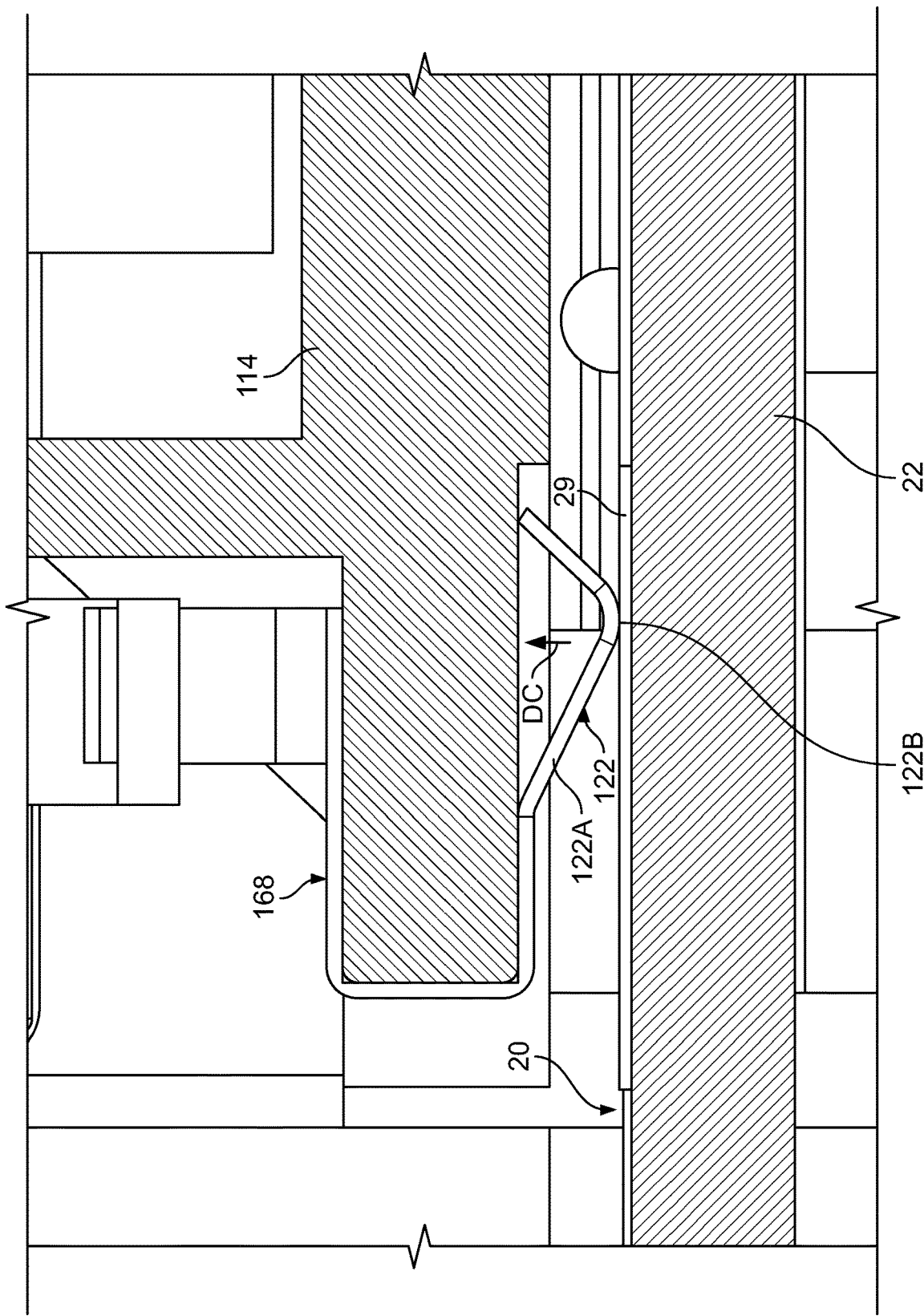
FIG. 8 is a fragmentary, cross-sectional view of the SPD circuit system of FIG. 1 taken along the line 8-8 of FIG. 1.
Figure 9:
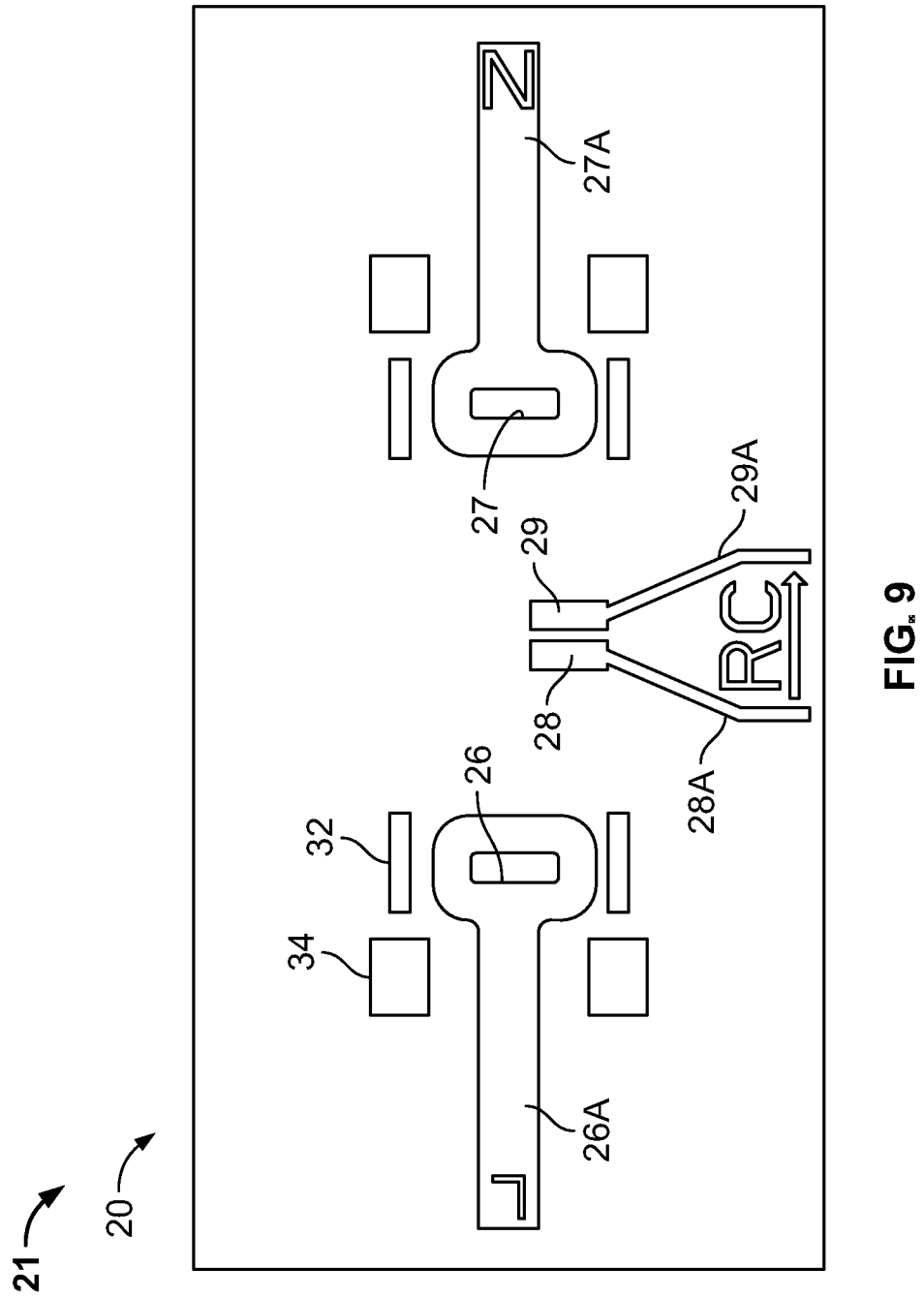
FIG. 9 is a top plan view of a PCB assembly forming a part of the SPD circuit system of FIG. 1.
Figure 10:
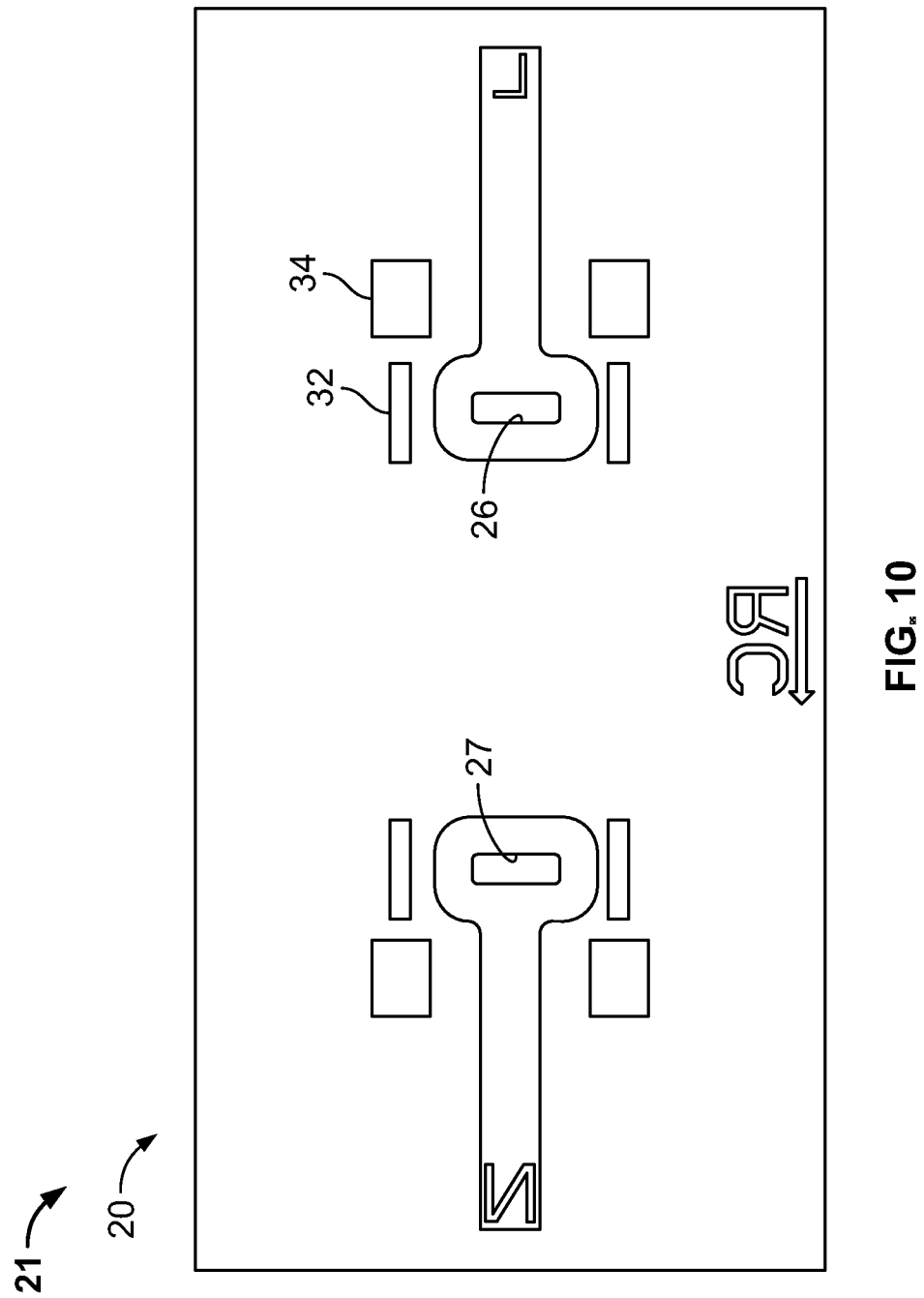
FIG. 10 is a bottom plan view of the PCB assembly of FIG. 9.
Figure 11:
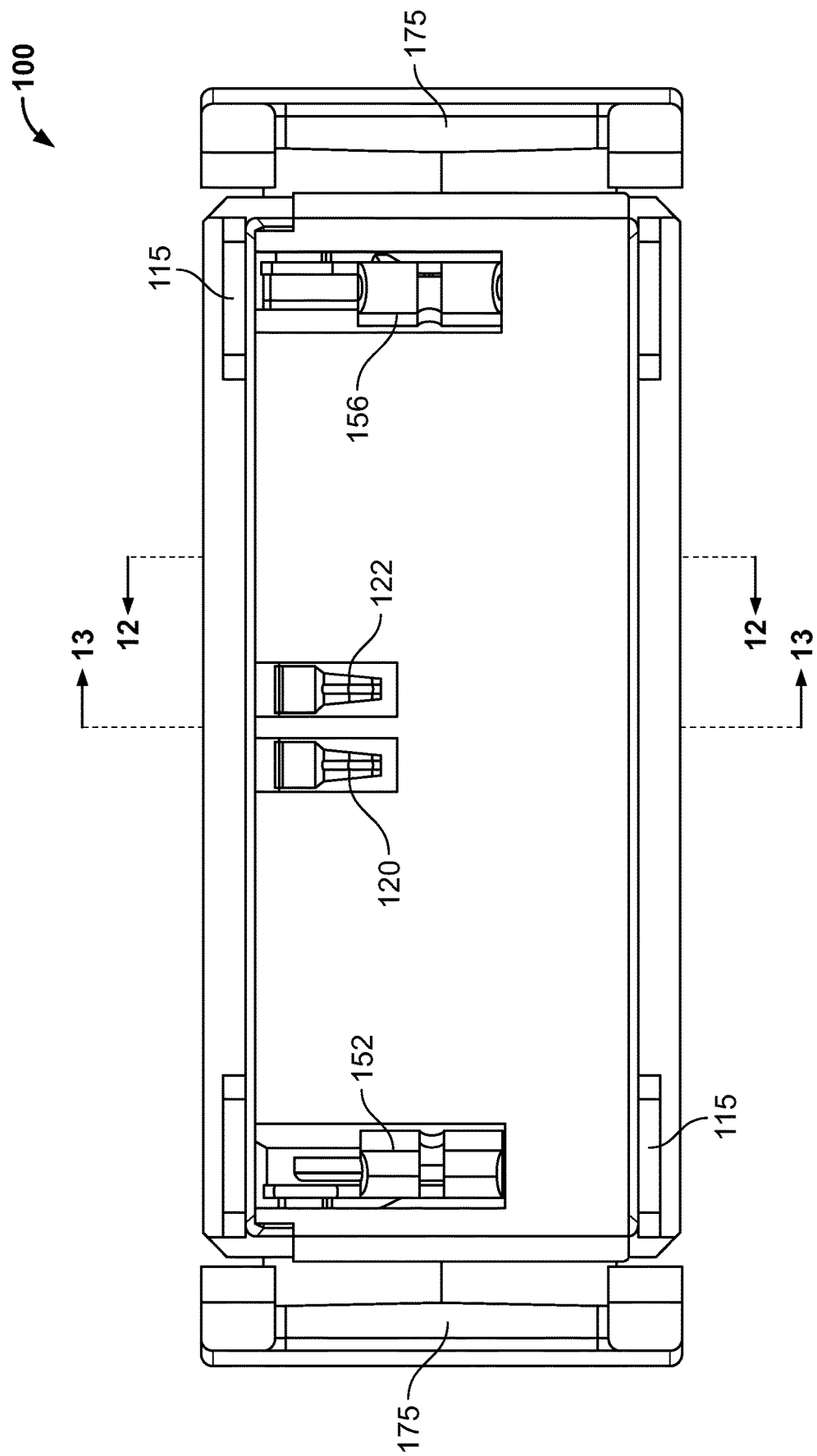
FIG. 11 is a bottom plan view of the SPD module of FIG. 1.
Figure 12:
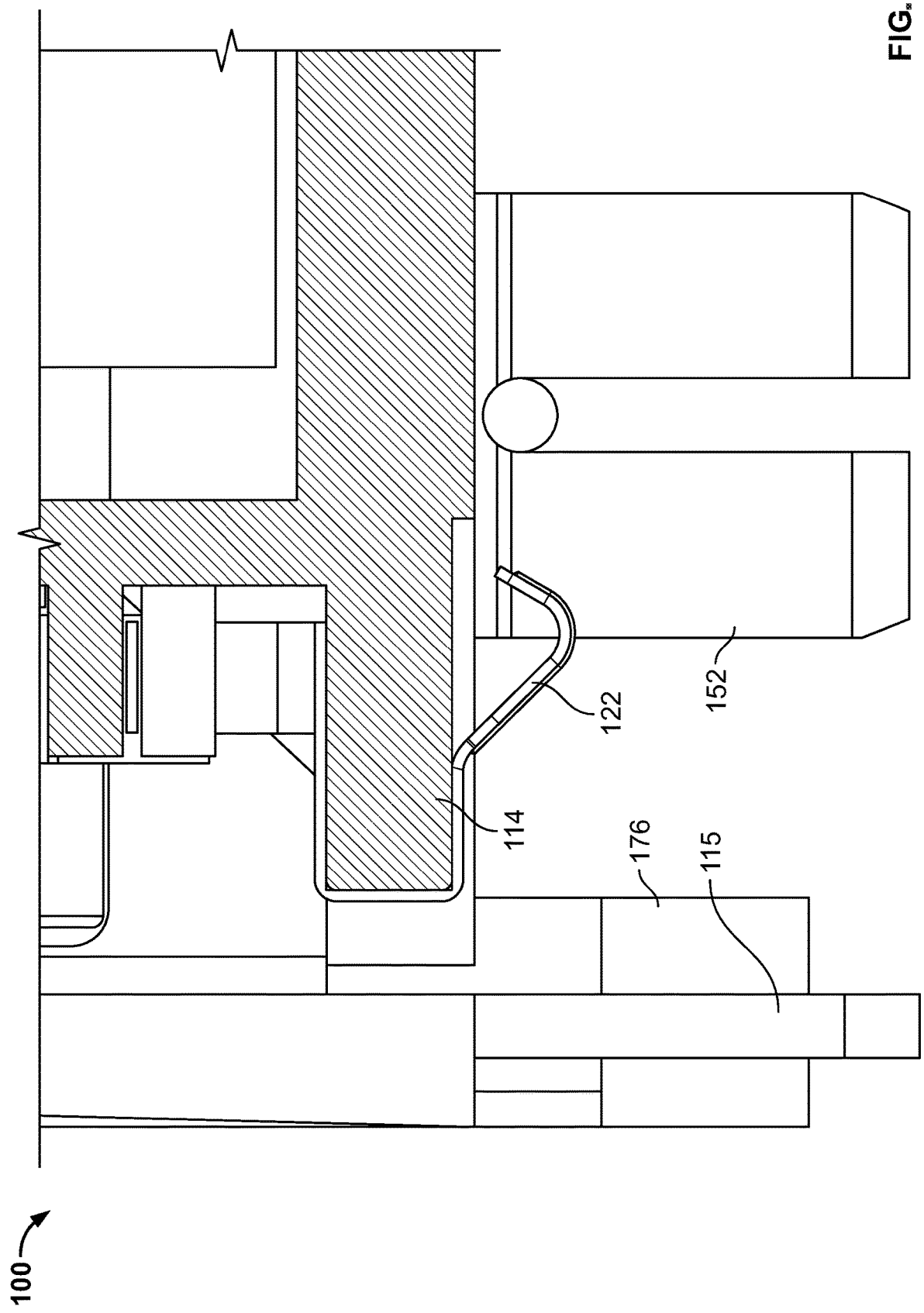
FIG. 12 is a fragmentary, cross-sectional view of the SPD module of FIG. 1 taken along the line 12-12 of FIG. 11.
Figure 13:
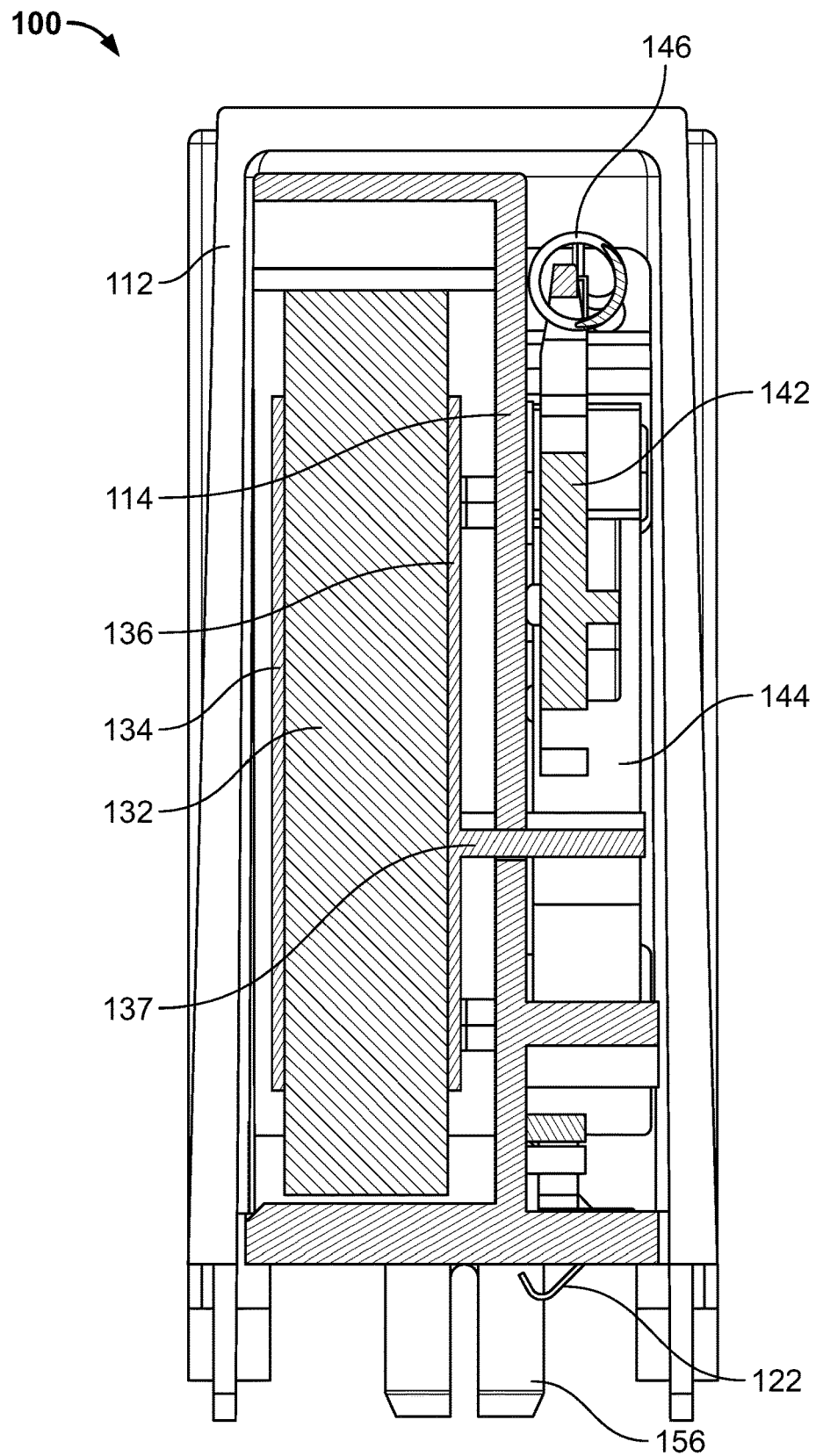
FIG. 13 is a cross-sectional view of the SPD module of FIG. 1 taken along the line 13-13 of FIG. 11.

In some embodiments and as shown, the overvoltage clamping element subassembly 130 includes a varistor 132, a first electrode 134 (also referred to herein as the "ground electrode"), and a second electrode 136 (also referred to herein as the "disconnect electrode") (FIGS. 5, 6 and 13). The varistor 132 has opposed contact surfaces 132A, 132B.

The varistor material of the varistor 132 may be any suitable material conventionally used for varistors, namely, a material exhibiting a nonlinear resistance characteristic with applied voltage. In some embodiments, the varistor 132 is a metal oxide varistor (MOV). In some embodiments, the resistance becomes very low when a prescribed voltage is exceeded. The varistor material may be a doped metal oxide or silicon carbide, for example. Suitable metal oxides include zinc oxide compounds.

The first or ground electrode 134 includes a contact portion 134A, and an integral terminal tab 134C. The ground electrode 134 is electrically conductive. In some embodiments, the ground electrode 134 is formed of metal.

The second or disconnect electrode 136 includes a contact portion 136A and a terminal tab 137. The disconnect electrode 136 is electrically conductive. In some embodiments, the disconnect electrode 136 is formed of metal.

The ground electrode 134 and the disconnect electrode 136 are mounted on the outer surfaces 132A and 132B of the varistor 132. More particularly, the ground electrode 134 may be bonded to the metallization layer of the contact surface 132A by solder and the disconnect electrode 136 is bonded to the metallization layer of the contact surface 132B by solder so that the electrodes 134 and 136 are electrically connected to the contact surfaces 132A and 132B, respectively.

The terminal tab 137 serves as an electrical conductor that extends laterally through the frame 114. A section of the terminal tab 137 projects laterally a prescribed extension distance laterally beyond the surface 132B of the varistor 132.

Figure 2:
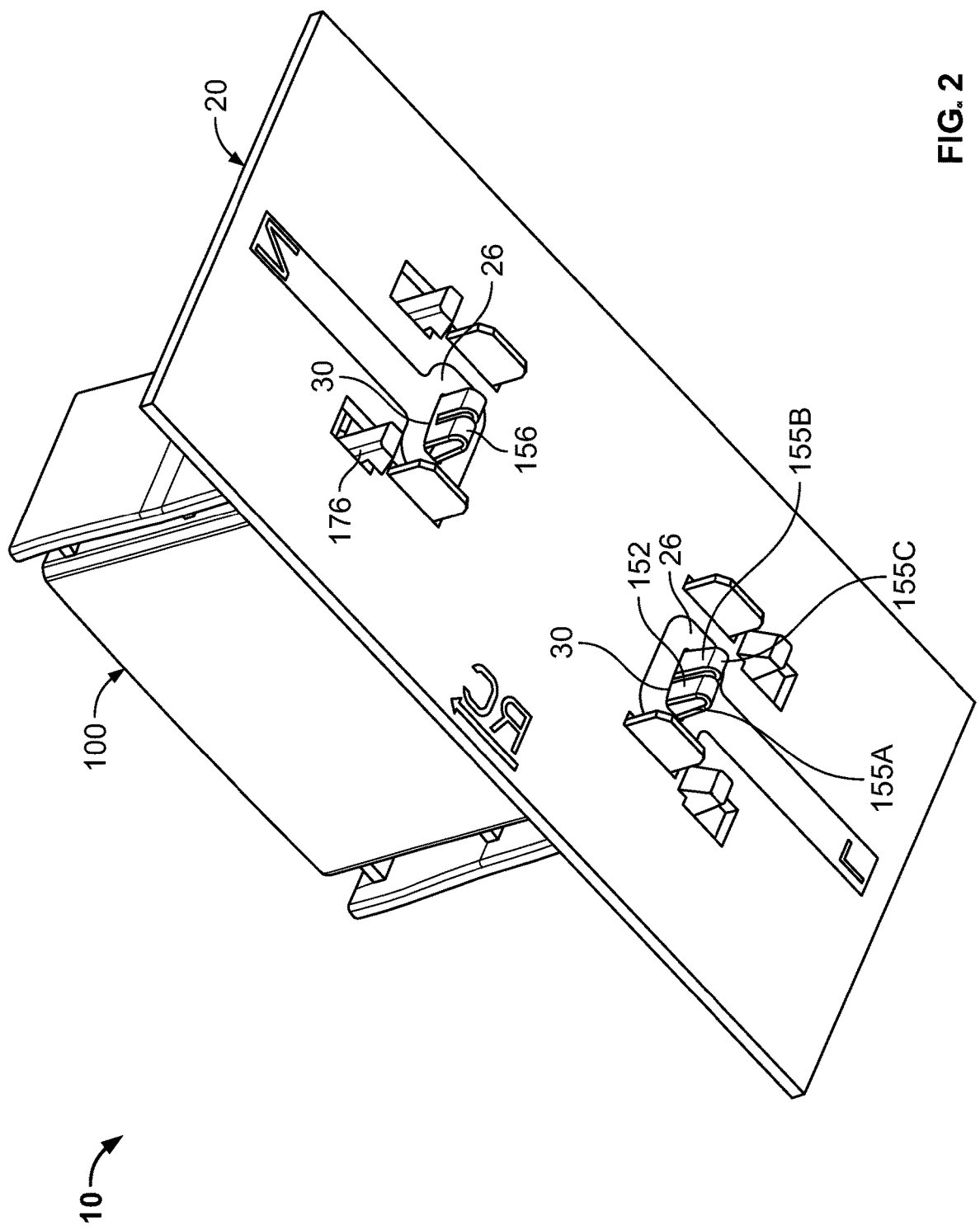
FIG. 2 is a bottom perspective view of the SPD circuit system of FIG. 1.
Figure 3:
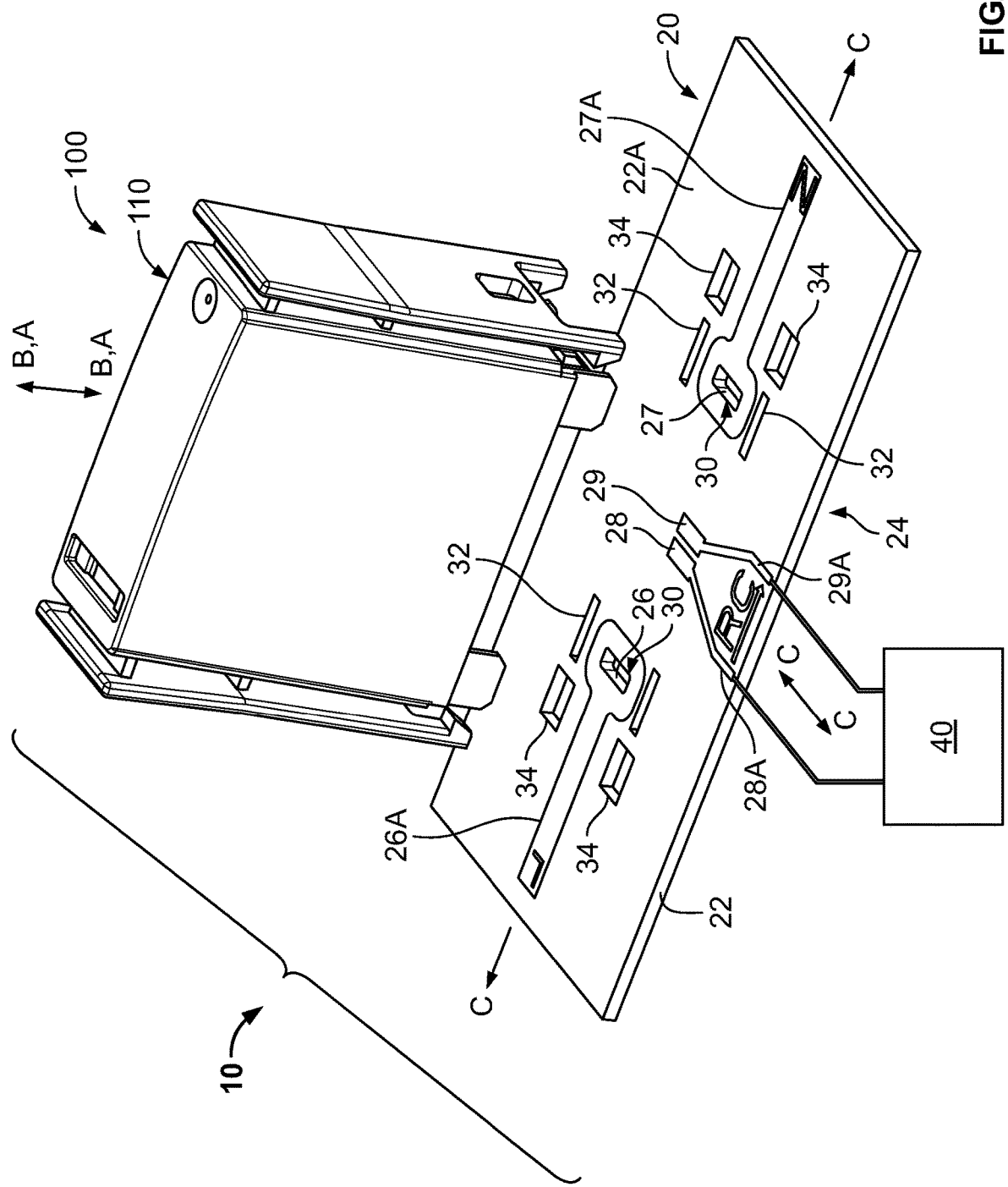
FIG. 3 is an exploded, top perspective view of the SPD circuit system of FIG. 1.
Figure 4:
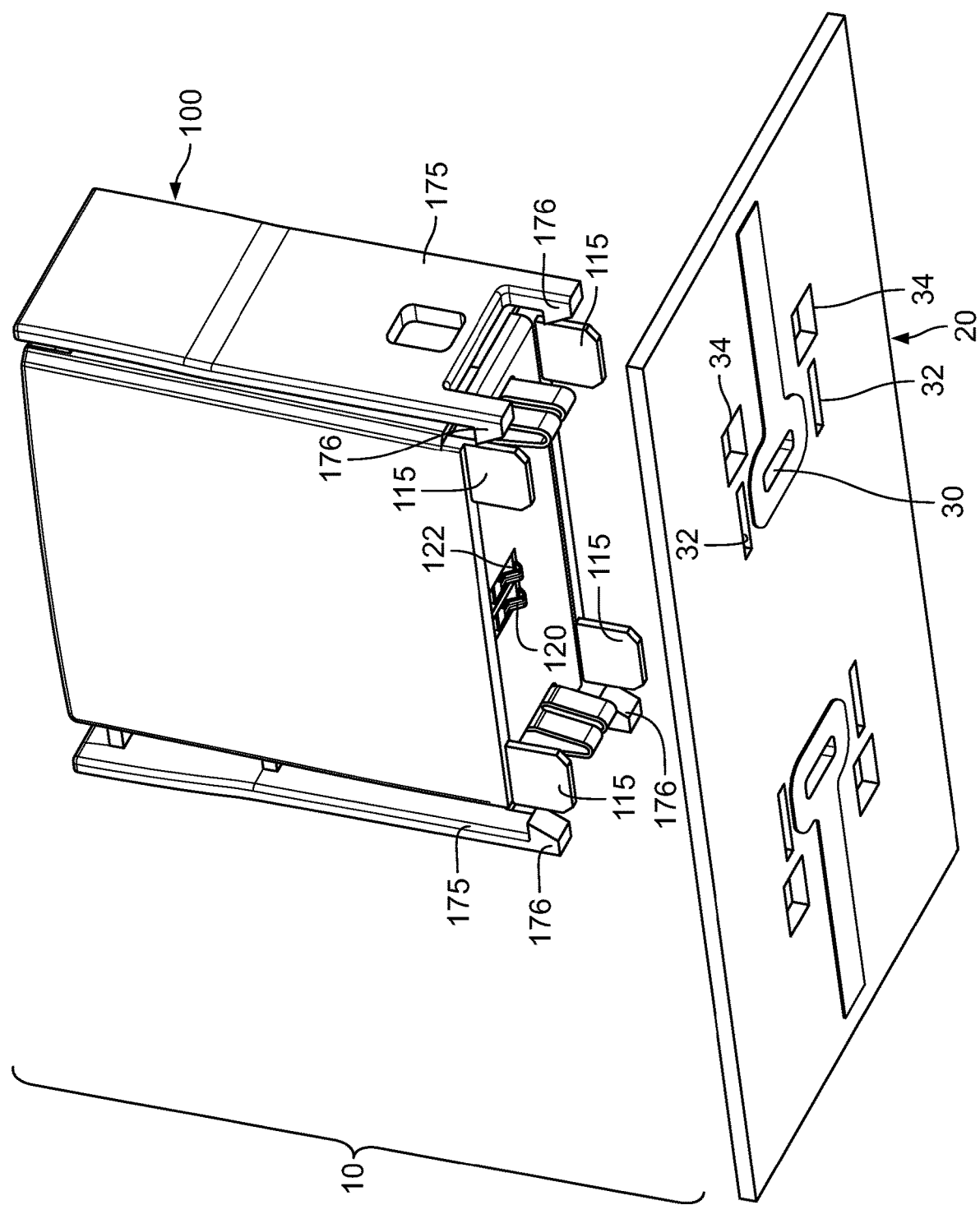
FIG. 4 is an exploded, bottom perspective view of the SPD circuit system of FIG. 1.

Each of the power connector members 150, 154 includes an integral power terminal connector 152, 156. Each power terminal connector 152, 156 is or includes a V-shaped through hole spring contact 155 including a pair of opposed contact sections 155A, 155B joined by an elastically flexible bend 155C (FIG. 2).

The power connector members 150, 154 may be formed of any suitable material or materials. In some embodiments, the power connector members 150, 154 are formed of metal. Suitable metal materials may include nickel brass, CuSn 0.15, CuSN 6, CuP 0.008, for example. In some embodiments, each of the power connector members 150, 154 is unitary and, in some embodiments, is monolithic.

According to some embodiments, the solder 149 is selected such that its melting point is greater than a prescribed maximum standard operating temperature, but less than or equal to a prescribed disconnect temperature. The maximum standard operating temperature may be the greatest temperature expected in the solder 149 during normal operation (including handling overvoltage surges within the designed for range of the module 100). The prescribed disconnect temperature is the temperature of the solder 149 at with the solder 149 is intended to release the second swingarm 144 in order to actuate the thermal disconnector mechanism 140 and the module condition indicator mechanism 160, as discussed below.

Figure 14:
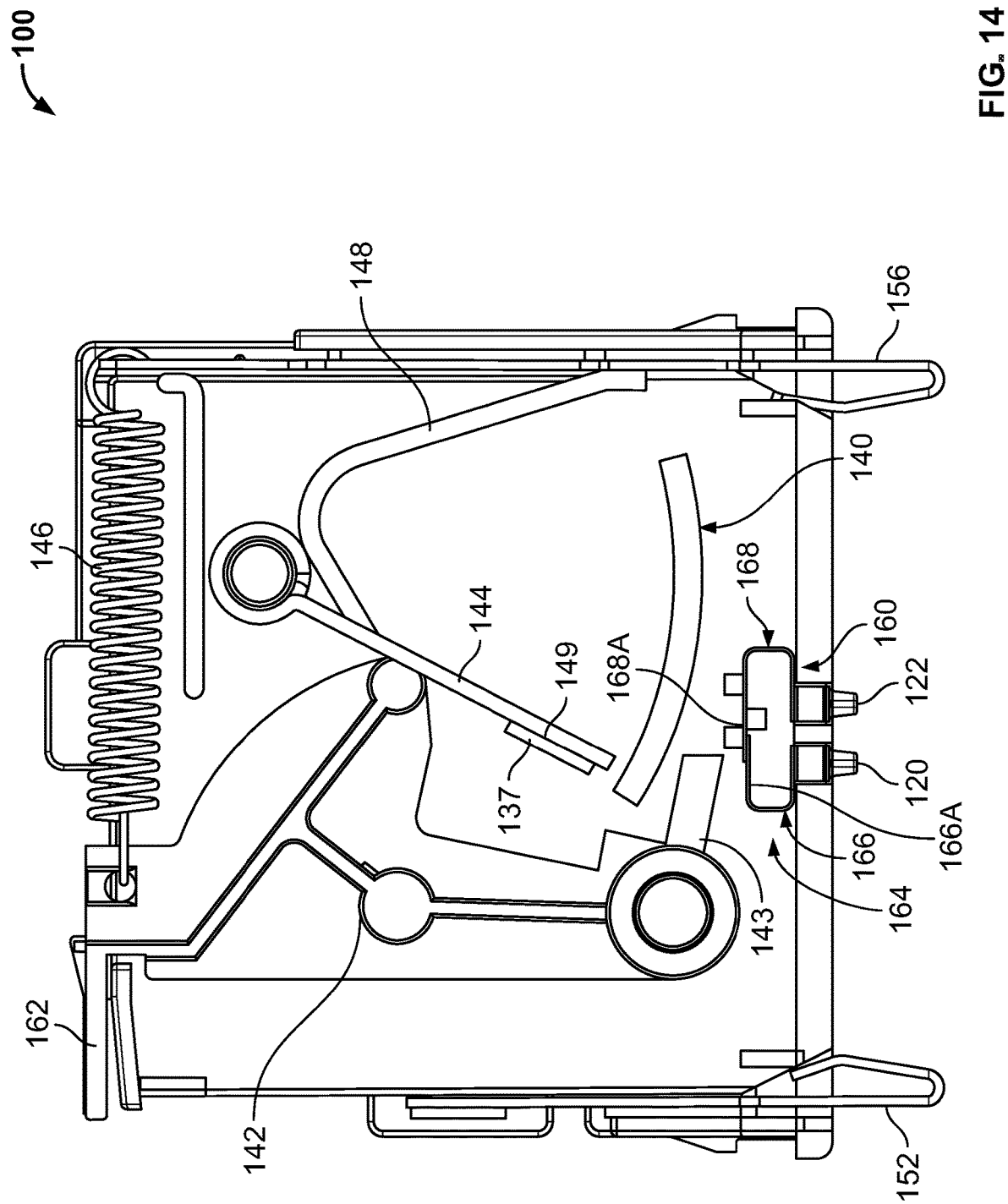
FIGS. 14 and 15 are fragmentary views of the SPD module of FIG. 1.

The thermal disconnector mechanism 140 includes a disconnect spring 146, the layer of solder 149, a first swingarm 142, an electrically conductive second swingarm 144, and a flexible bridge conductor 148 (FIGS. 5 and 14).

The flexible bridge conductor 148 is formed of an electrically conductive material (e.g., copper) and electrically connects the terminal tab 137 to the power connector member 154.

The first swing arm 142 is pivotably mounted on the frame 114. The rear end of the first swing arm 142 includes a switch actuation feature 143 (FIG. 14). The disconnect spring 146 is elastically stretched so that it exerts a persistent pull force on the first swing arm 142.

The module condition indicator mechanism 160 includes the first swing arm 142, an indicator flag 162, and a remote indicator switch 164. The remote indicator switch 164 serves as an integrated remote signal circuit or device in the SPD module 100.

Figure 15:
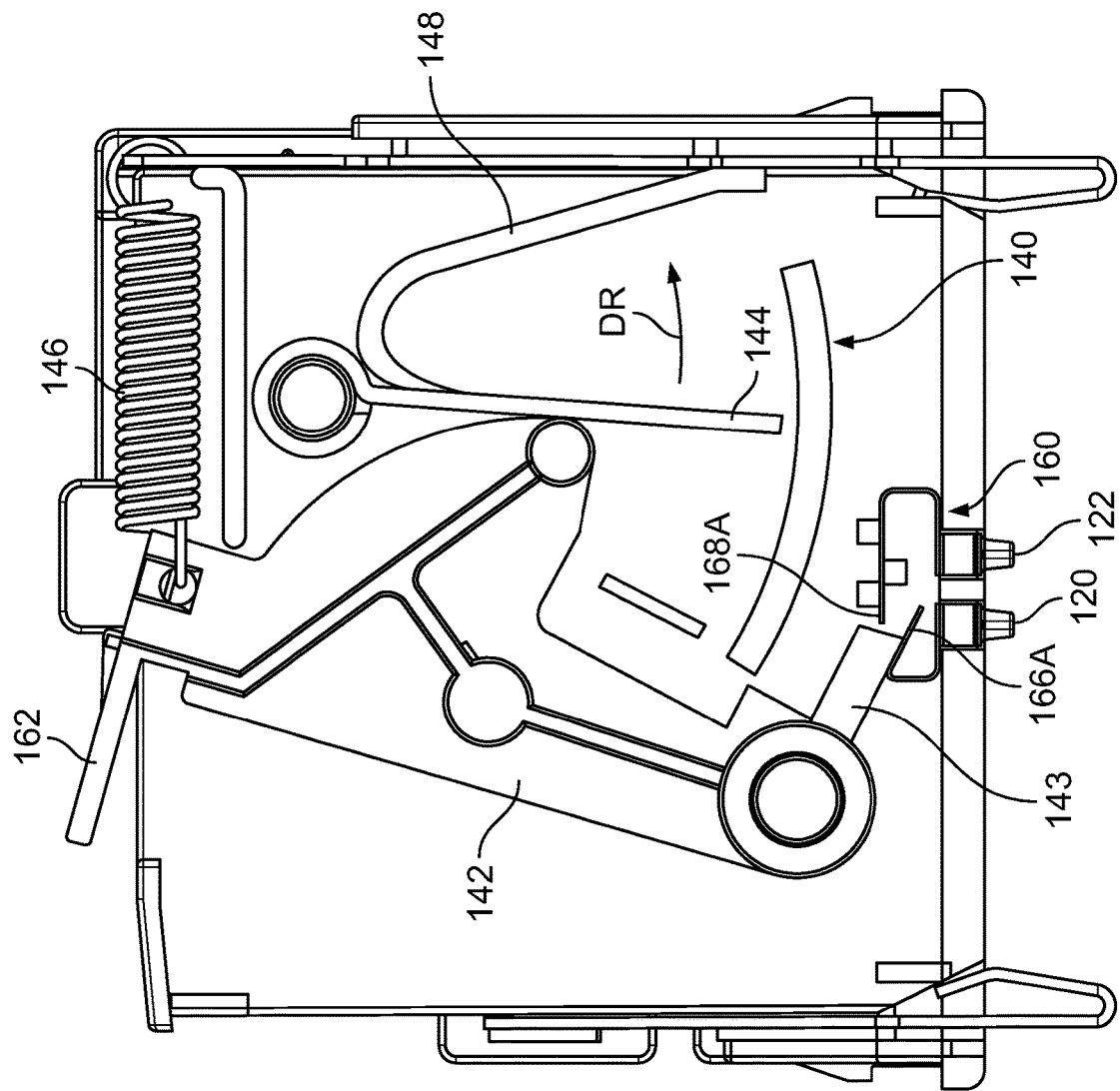
Figure 16:
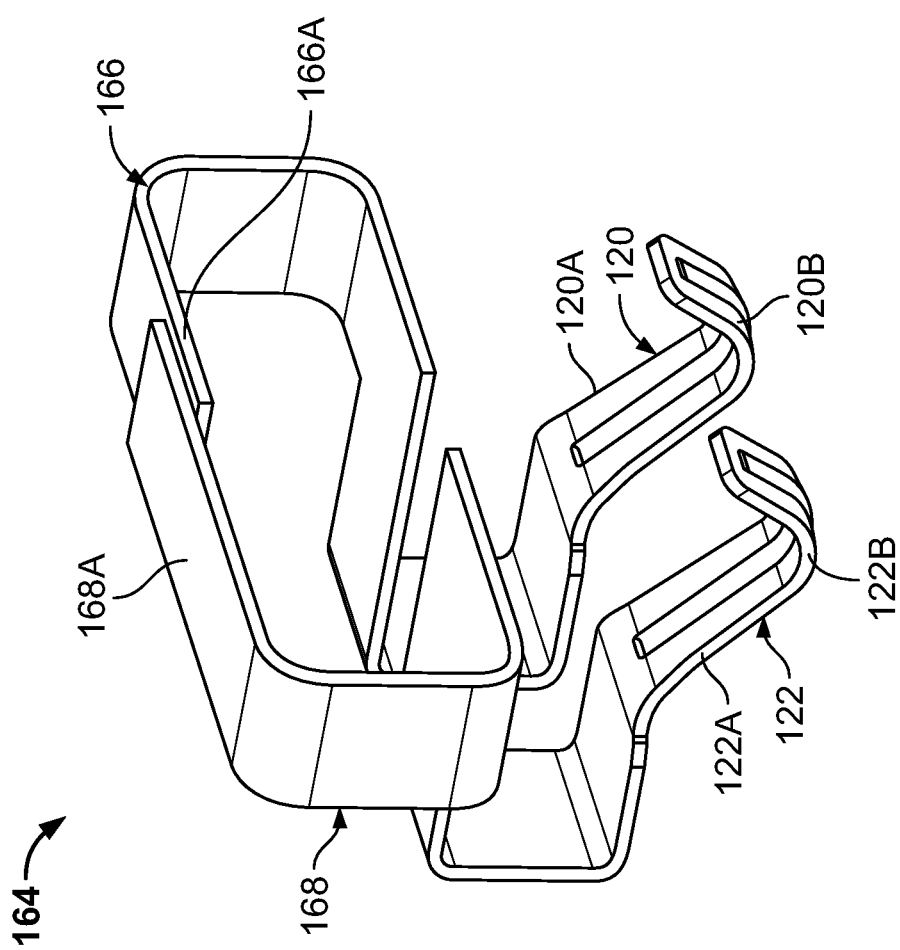
FIGS. 16 and 17 are opposed perspective views of a remote indicator switch forming a part of the SPD module of FIG. 1.
Figure 17:
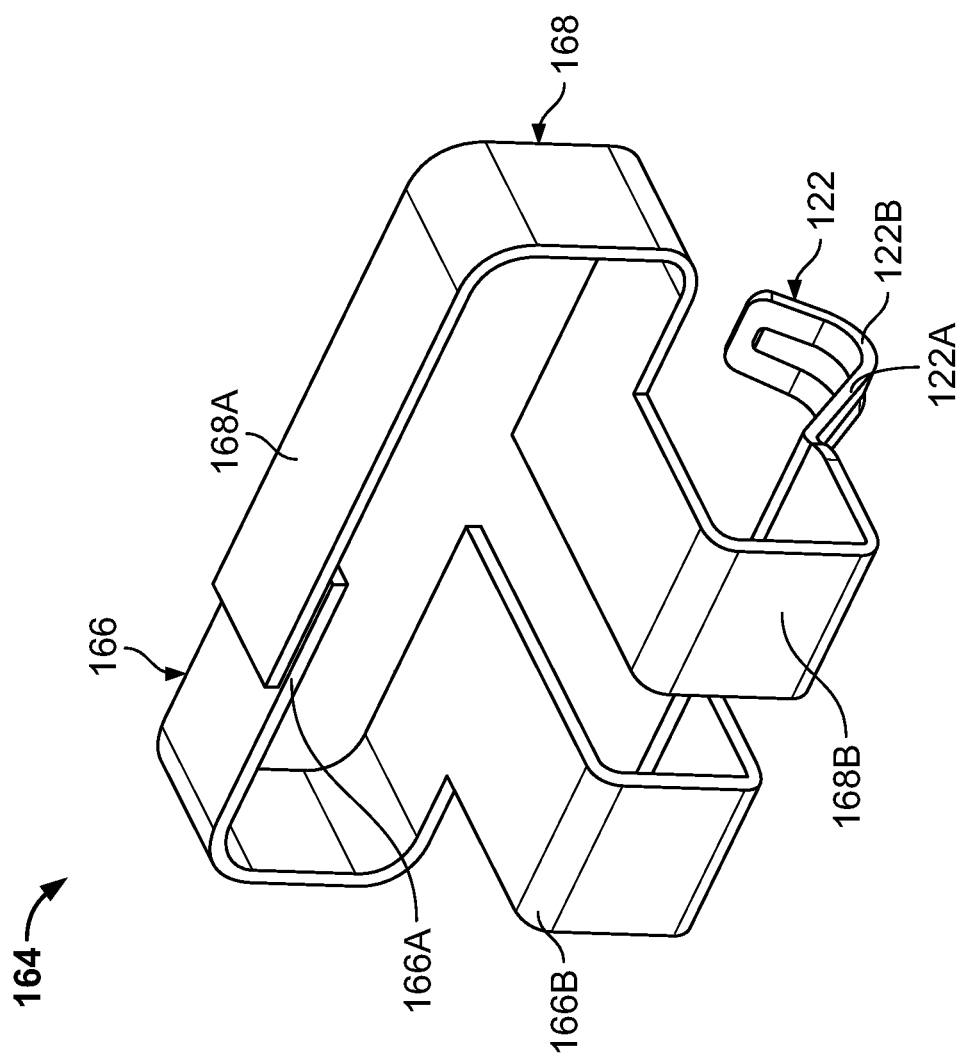
Figure 18:
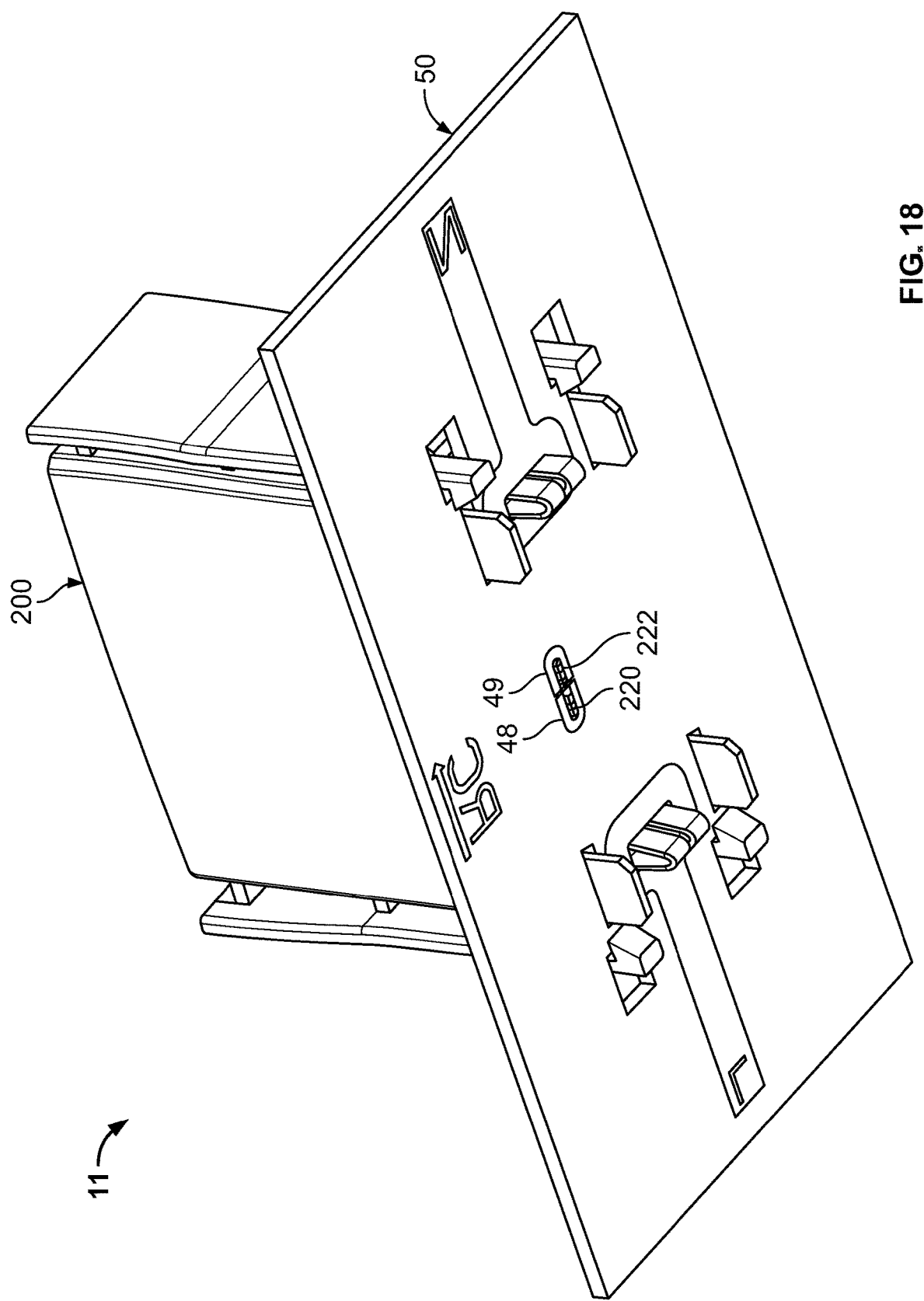
FIG. 18 is a bottom perspective view of an SPD circuit system according to further embodiments.
Figure 19:
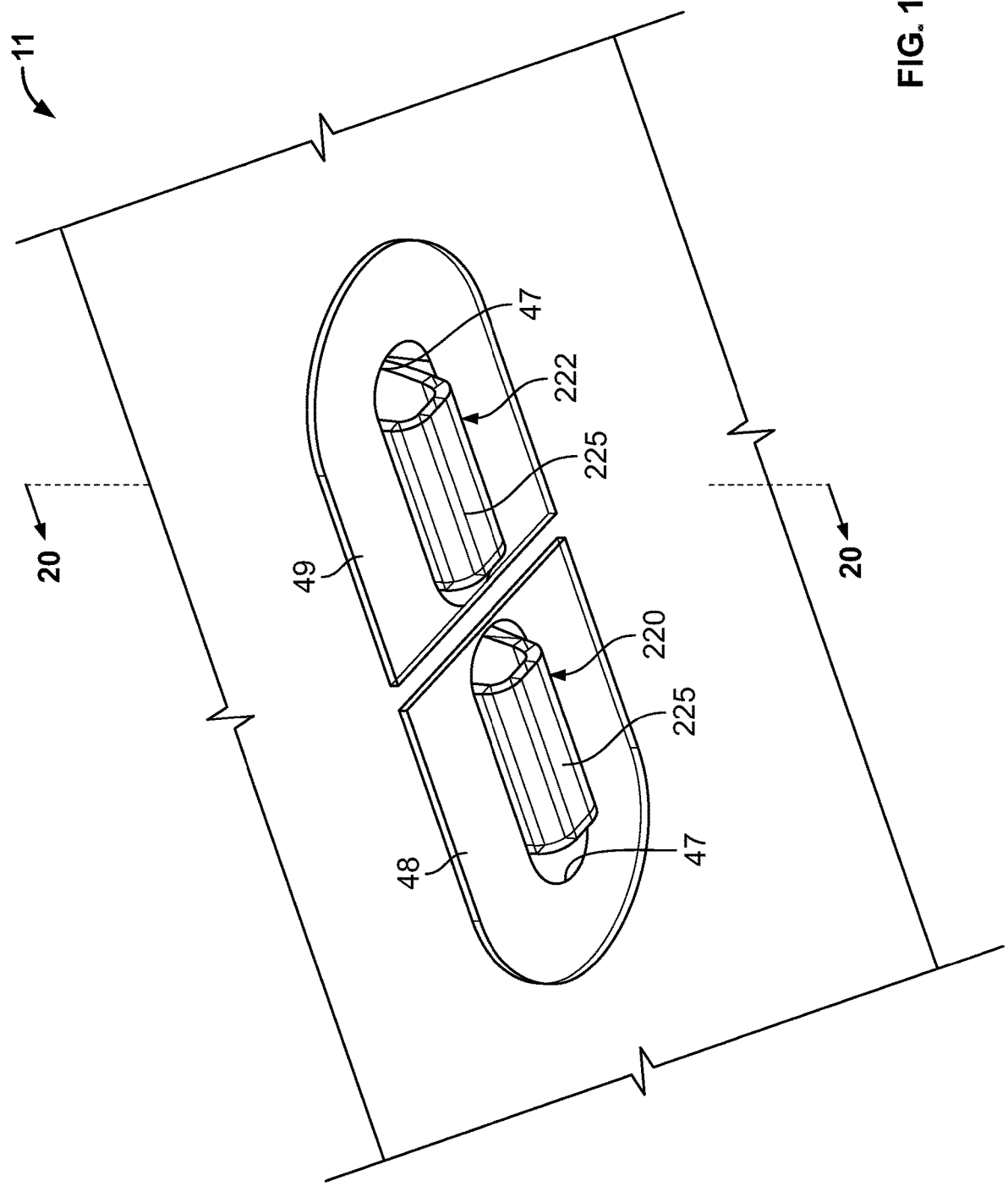
FIG. 19 is a fragmentary, bottom perspective view of the SPD circuit system of FIG. 18.
Figure 20:
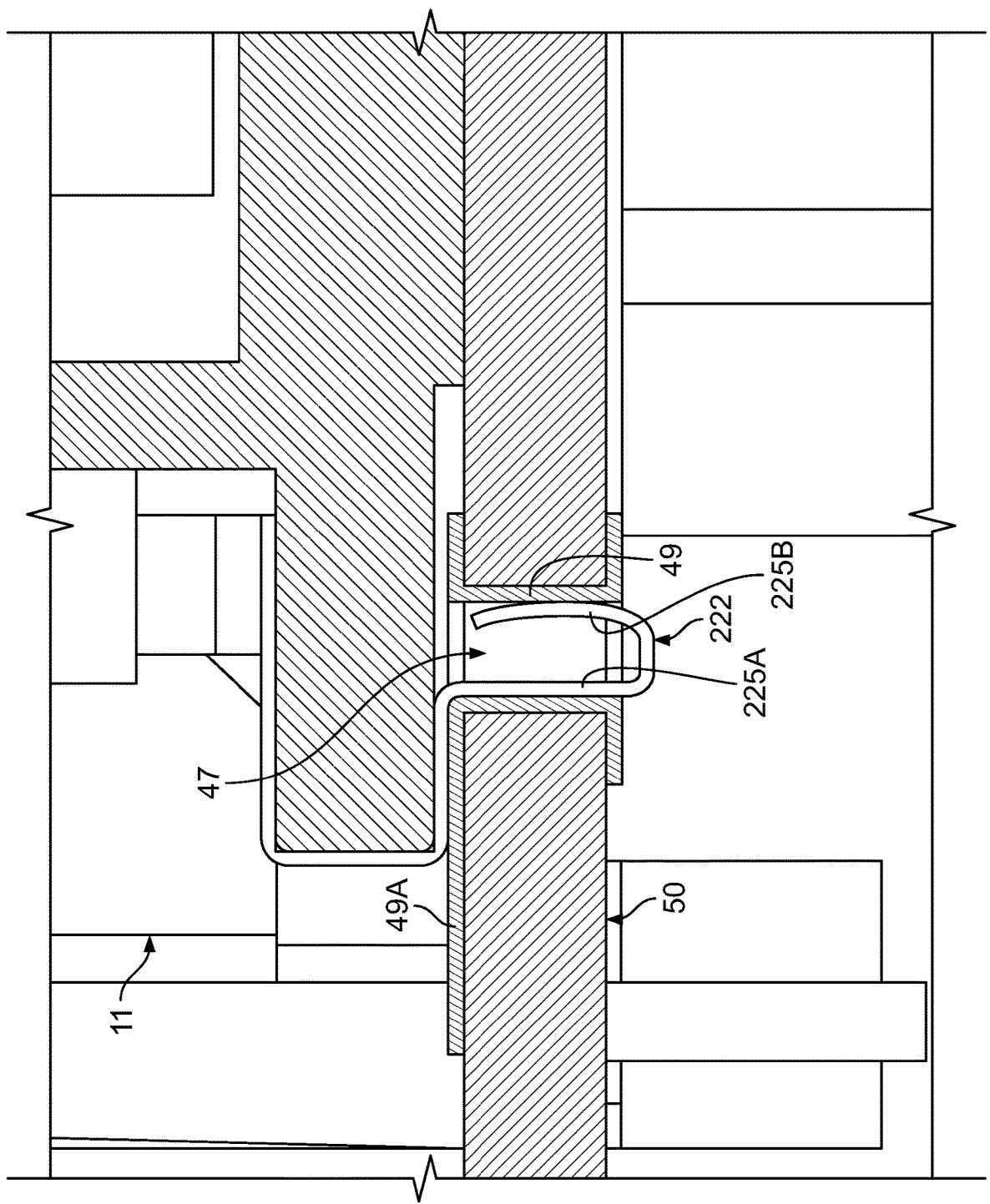
FIG. 20 is a fragmentary, cross-sectional view of the SPD circuit system of FIG. 1 taken along the line 20-20 of FIG. 19.
Figure 21:
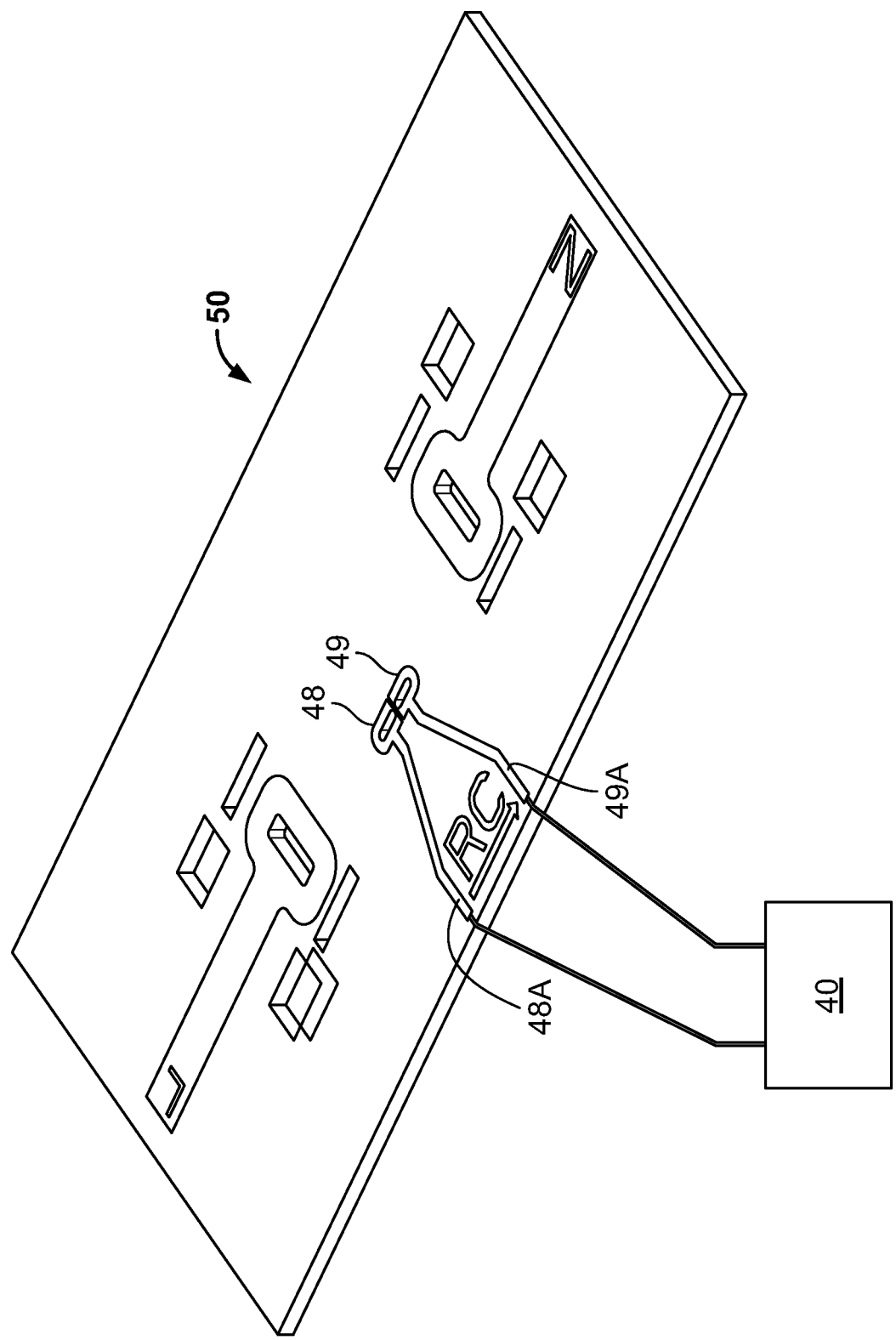
FIG. 21 is a top perspective view of a PCB assembly forming a part of the SPD circuit system of FIG. 18.
Figure 22:
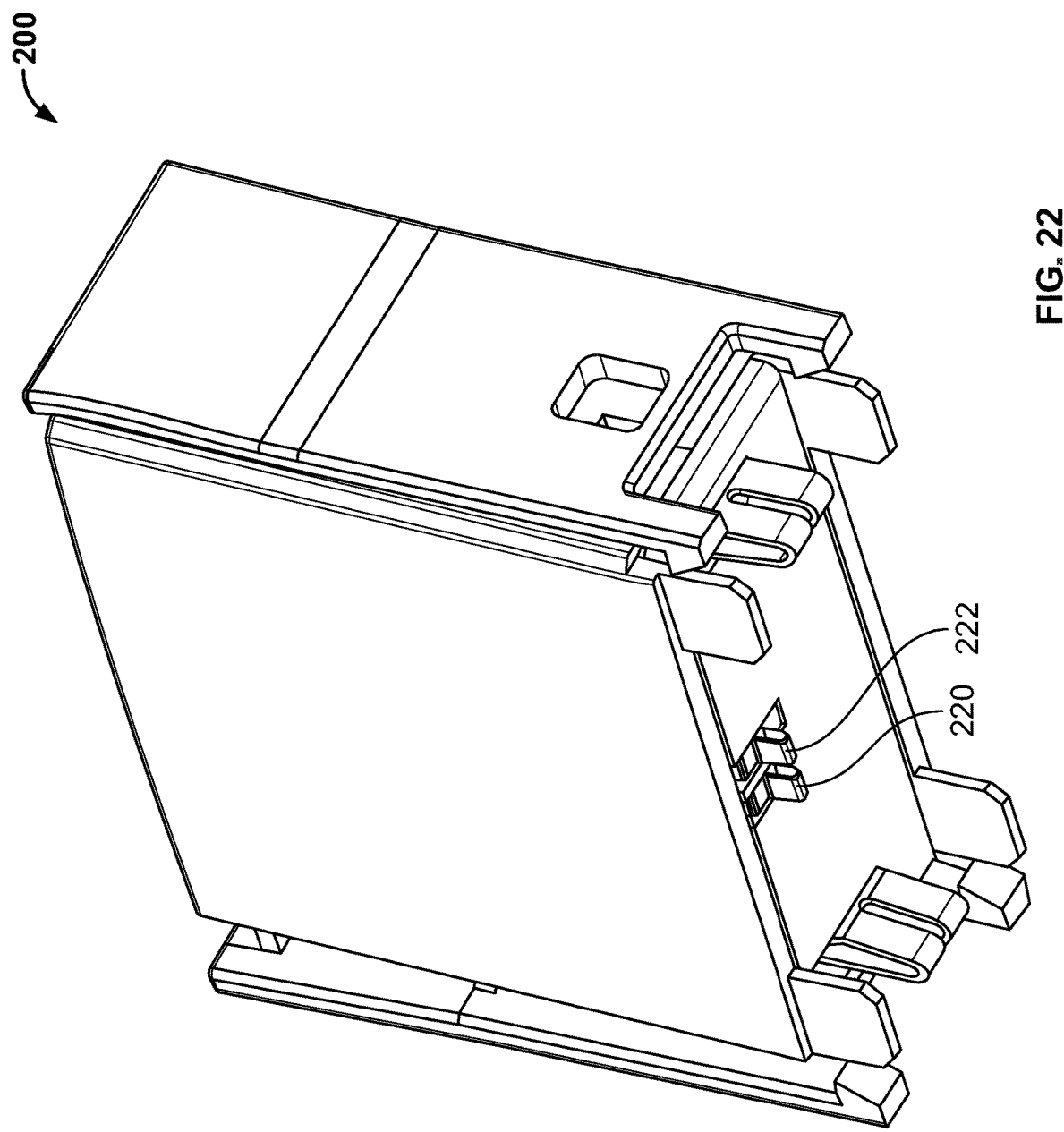
FIG. 22 is bottom perspective view of an SPD module forming a part of the SPD circuit system of FIG. 18.
Figure 23:
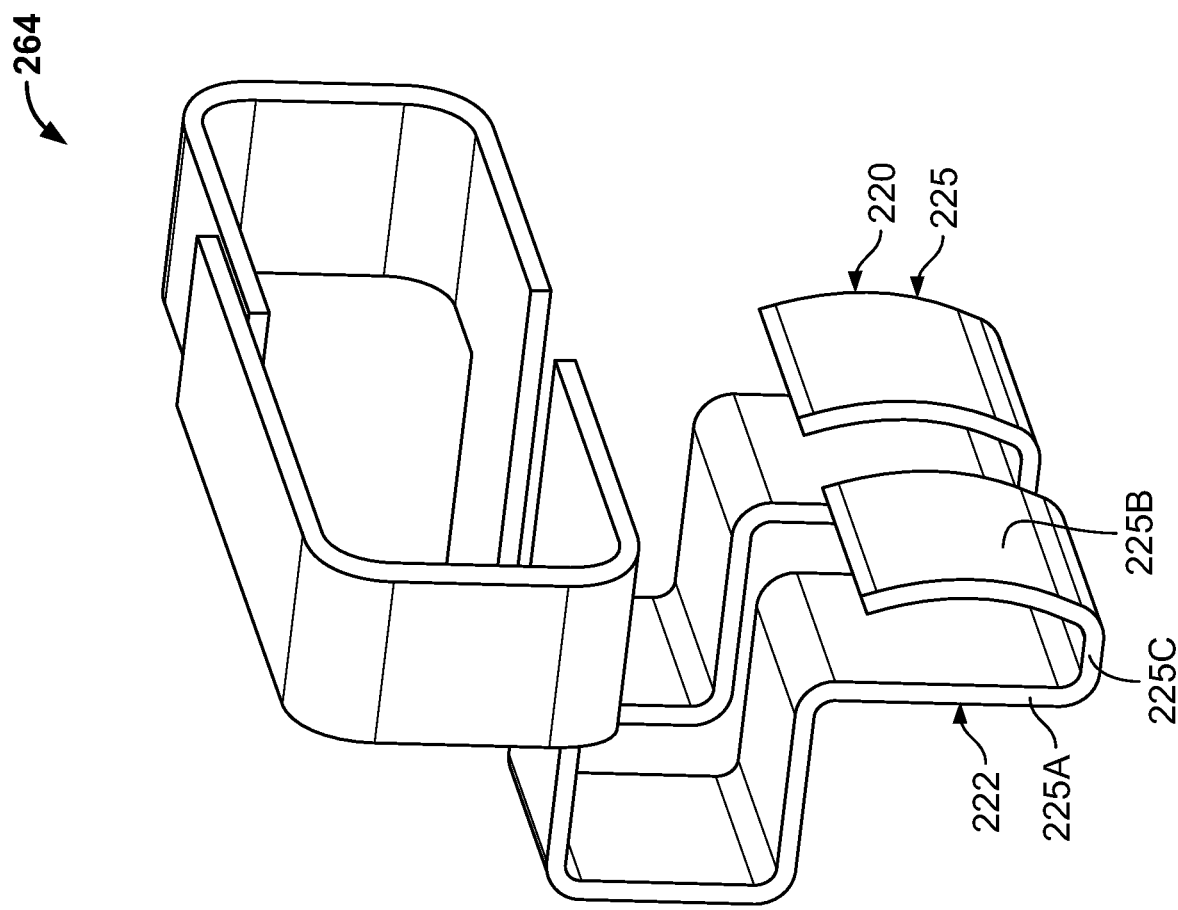
FIG. 23 is a perspective view of a remote indicator switch forming a part of the SPD module of FIG. 22.

The remote indicator switch 164 includes a first switch member 166 and a second switch member 168 (FIGS. 14, 16 and 17). The first switch member 166 includes a switch contact 166A and the RS connector 120 joined by a bridge portion 166B. The second switch member 168 includes a switch contact 168A and the RS connector 122 joined by a bridge portion 168B. The switch contact 166A is deflectable from a closed position (as shown in FIG. 14) to an open position (as shown in FIG. 15).

In the closed position, the remote indicator switch 164 provides electrical continuity from the RS connector 120 to the RS connector 122 through the remote indicator switch 164. In the open position, the circuit is opened and the remote indicator switch 164 eliminates electrical continuity from the RS connector 120 to the RS connector 122 through the remote indicator switch 164.

The RS connector 120 includes an RS spring contact 121. The RS connector 122 includes an RS spring contact 123. The RS spring contact 121 includes a spring leg 120A and an RS contact portion 120B. The RS spring contact 123 includes a spring leg 122A and an RS contact portion 122B. The spring contacts 121, 123 are mounted on and supported by (directly or indirectly) the module housing 110.

The bridge portions 166B, 168B extend through the rear wall slots 118. The spring legs 120A, 122A are resilient and cantilevered from their respective bridge portions 166B, 168B so that the contact portions 120B, 122B can be elastically deformed or deflected in a compression direction DC (FIG. 8) toward the front of the module 100. The contact portions 120B, 122B extend laterally across the rear side of the module housing 110.

The RS connectors 120, 122, and the remainders of the switch members 166, 168, may be formed of any suitable material or materials. In some embodiments, the RS connectors 120, 122 are formed of metal. In some embodiments, the RS connectors 120, 122 are formed of resilient, elastically deflectable metal. Suitable metal materials may include nickel brass, CuSn 0.15, CuSN 6, CuP 0.008, for example. In some embodiments, each switch member 166, 168 is unitary and, in some embodiments, is monolithic.

The SPD system 10 and the SPD module 100 may be used as follows in accordance with methods of the present invention.

When the module 100 is assembled in the ready configuration as shown in FIG. 15, the disconnect spring 146 is elastically deformed, deflected or stretched so that it persistently exerts (via the first swingarm 142) a biasing load on the solder 149 pulling the second swingarm 144 away from the terminal tab 137 in a release direction DR. The switch contacts 166A and 168A are engaged (i.e., closed). The first swing arm 142 is held back by the second swing arm 144.

The SPD module 100 (in the ready configuration) is axially plugged or inserted, in an insertion direction along the axis A-A, into the PCB 20 such that the power terminal connectors 152, 156 are received in respective ones of the receiver slots 30, the fixed tabs 115 are received in the slots 32, and the locking tabs 175 are received in the slots 34. In doing so, the remote contact portions 120B, 122B of the RS spring contacts 121, 123 are pressed into contact with the RS PCB pads 28, 29 between the PCB 20 and the housing 110.

More particularly, the power terminal connectors 152, 156 slide into the slots 30. The V-shaped spring contacts 155 of the power terminal connectors 152, 156 slide into the slots 30 and engage the through-hole plated contacts 26, 27 inside the slots 30. In some embodiments, the relaxed width of each contact 155 is greater than the corresponding width of its PCB slot 26, 27 so that the contact sections 155A, 155B of spring contacts 155 are elastically pushed together by the slots 30. As a result, the seated spring contacts 155 exert a persistent engagement force against the through-hole plated contacts 26, 27.

In some embodiments, the remote connector spring legs 120A, 122A are elastically deflected toward the rear wall of the module housing 110, so that RS spring contacts 121 and 123 apply a persistent spring loading of the remote contact portions 120B and 122B against the RS PCB contact pads 28 and 29, respectively.

The latch features 176 of the locking tabs 175 interlock with the back side of the PCB substrate 22 to inhibit or prevent unintended removal of the SPD module 100 from the PCB 100, as shown in FIGS. 1 and 2. In doing so, they ensure that the remote contact portions 120B, 122B remain in contact with the RS PCB pads 28, 29. The SPD module 100 can be removed from the PCB 20 by deliberately bending the locking tabs 175 out of interlocking engagement.

The SPD module 100 can be released and removed from the PCB 20 as needed. The SPD module 100 or other suitably configured modules can be remounted on the PCB 20, and this can be repeated multiple times. For example, in the event that the varistor 132 of the SPD module 100 is degraded or destroyed or no longer of proper specification for the intended application, the SPD module 100 can be replaced on the PCB 20 with a fresh or suitably constructed module.

The SPD module 100 is thus directly mountable on the PCB 20. The remote connectors 120, 122 provide a direct electrical contact connection between the remote indicator signalization circuit of the SPD module 100 and the RS PCB pads 28, 29 that connect to the SPD monitoring system 40. No solder or additional parts are required to make these connections.

Because the mounting of the SPD module 100 is made without solder, the mount is nonpermanent. The SPD module 100 can be removed from the PCB and replaced without destroying the SPD module 100 or the PCB 20. For example, the SPD module can be individually removed and replaced in the event the SPD module 100 fails.

The spring contacts 121, 123 can also help to form and maintain a reliable electrical connection with the RS PCB pads 28, 29 by providing fit tolerance and accommodating movement, vibration, and stresses in the parts.

The SPD monitoring system 40 is configured to detect, via the RS PCB pads 28, 29, whether a functional SPD module 100 is installed on the PCB 20. When the SPD module 100 fails, the SPD monitoring system 40 will detect, via the RS PCB pads 28, 29, that the remote indicator switch 164 is in an open state. Removal of an SPD module 100 will disconnect the remote indicator switch 164 from the RS PCB pads 28, 29, from which the SPD monitoring system 40 detects and determines that a functional SPD module 100 is no longer present.

The SPD monitoring system 40 may be configured to generate a failure alarm in response to detecting a failure of the SPD module 100. The SPD monitoring system 40 may be configured to generate a failure alarm in response to detecting that the SPD module 100 is not present on the PCB 20.

In use, the state of the SPD module 100 will depend on the state of the thermal disconnector mechanism 140, which may in turn depend on the condition of the clamping element 130.

When the SPD module 100 is initially installed, the thermal disconnector mechanism 140 is in its ready position, wherein the swing arm 142 is held in a retracted position.

Therefore, the remote indicator switch 164 is closed. The closed state of the remote indicator switch 164 is detected by the SPD monitoring system 40 via the RS PCB pads 28, 29. The SPD module 100 thereby provides feedback through the remote indicator switch 164 that the module 100 has been seated in the PCB 20 and the SPD module 100 is in its ready or operational (non-failed) condition. The remote indicator switch 164 thereby serves as an SPD module presence sensor.

During use or operation, the thermal disconnector mechanism 140 is actuated as follows. The solder 149 is heated until the solder 149 melts and permits the elastic spring loads of the spring 146 to pull the swing arm 142 in the direction DR. The swing arm 142 thereby pushes the second swing arm 144 away from the terminal tab 137 and thereby out of electrical continuity with the electrode 136. The varistor 132 is thereby electrically disconnected from the power connector member 154, creating an open circuit between the power terminals 152, 156.

The actuation of the thermal disconnector mechanism 140 and also opens the remote indicator switch 164. As discussed above, in the ready position of the SPD module 100, the switch contact 166A is in contact with the switch contact 168A, thereby providing electrical continuity between the remote connectors 120, 122. When the first swing arm 142 is forcibly pivoted by the spring 146 in the direction DR, the switch actuation feature 143 of the first swing arm 142 displaces, deflects or deforms the switch contact 166A out of contact with the switch contact 168A, which opens the circuit between the remote connectors 120 and 122. The loss or absence of electrical continuity between the remote connectors 120, 122 is detected by the SPD monitoring system 40. In this manner, the module condition mechanism 160 can serve as a thermal disconnect sensor and provides a convenient remote indication that the SPD module 100 has assumed its open circuit configuration or state.

In some embodiments, the SPD module 100 has several modes of operation as discussed below, depending on the state of the varistor 132 and external event conditions.

During normal operation (referred to herein as Mode 1), the SPD module 100 operates as an open circuit between the power terminals 152, 156. The thermal disconnector mechanism 140 remains in the ready position. In this normal mode, the varistor 132 is an insulator up to the nominal clamping voltage VNOM (and therefore the SPD module 100 is an insulator as well).

In the event of a transient overvoltage or surge current in the varistor 132 may be subjected to an overvoltage exceeding VNOM (referred to herein as Mode 2). In this case, the varistor 132 and temporarily and reversibly becomes a low resistance electrical conductor. In Mode 2, the thermal disconnector mechanism 140 is not actuated because the overvoltage event is short in duration and the heat generated by the surge current is insufficient to melt the solder 149.

If the surge or impulse current exceeds the maximum surge/impulse current that the SPD module 100 is rated for, the varistor 132 may fail internally as a short (with pinhole) or with limited resistance. In such cases, the mode of operations will be a failure mode as described below.

In a third mode (Mode 3), the varistor 132 is in end of life mode with a low leakage current between the lines (e.g., the lines L and N). The varistor 132 fails as a linear resistance. This type of varistor failure could be the result of multiple surge/impulse currents. The leakage current generates heat in the varistor 132 from ohmic losses. In some cases, the leakage current occurs during normal operation and is low (e.g., from about 0 to 0.5 A). The heat generated in the varistor 132 progressively deteriorates the varistor 132 and builds up over an extended duration.

In Mode 3, the thermal disconnector mechanism 140 operates. More particularly, the heat (e.g., from ohmic losses in the varistor 132) is transferred from the varistor 132 to the solder 149. Over an extended time period (e.g., in the range of from about 60 seconds to 48 hours), the heat builds up in the solder 149 until the solder 149 melts. The melted solder 149 releases the second swing arm 144, which is then forced by the spring 146 into an open or released configuration to open the circuit in the SPD module 100. The varistor 132 is thereby prevented from catastrophically overheating.

In a fourth mode (Mode 4), the varistor 132 is in good condition (i.e., not in end of life condition), but there is a Temporary Overvoltage (TOV) event wherein the voltage across the power terminals 152, 156 forces the varistor 132 to conduct an increased surge current (typically, in the range of from about 0 to 10 A). This current builds up heat over a duration (e.g., in the range of from about 5 seconds to 120 minutes) that is shorter than the duration of the surge current that triggers the fail-safe mechanism in Mode 3. In Mode 4, the thermal disconnector mechanism 140 is tripped (i.e., the second swing arm 144 is released by the solder 149) to open the circuit through the SPD module 100 in the same manner as described for Mode 3.

The actuation of the thermal disconnector mechanism 140 also actuates a local alert mechanism. The displacement of the swing arm 142 in the release direction DR displaces the indicator member 162 from the ready position (FIG. 14) to an indicating position (FIG. 15). This provides a visual alert or indication on the SPD module 100 so that an operator can readily determine that the SPD module 100 has assumed its open circuit configuration or state.

With reference to FIGS. 18-23, an SPD circuit network or system 11 according to further embodiments of the inventive concept is shown therein. The system 11 includes a PCB 50, an SPD monitoring system 40, and an SPD module 200 corresponding to the PCB 20, the SPD monitoring system 40, and the SPD module 100, except as follows. The system 11 and the SPD module 200 may be used in the same manner as the system 10 and the SPD module 100, except as discussed below.

The PCB 50 differs from the PCB 20 in that the PCB 50 includes remote through holes 47 and plated through-hole contacts 48, 49 therein, in place of the surface contact pads 28, 29 of the PCB 20.

The PCB module 100 includes remote signal (RS) connectors 220 and 222 in place of the RS connectors 120 and 122. Each RS connector 220, 222 is or includes a V-shaped through hole spring contact 225 including a pair of oppose contact sections 225A, 225B joined by an elastically flexible bend 225C. The connector 220, 222 may be connected to a remote indicator switch 264 (FIG. 23) corresponding to the remote indicator switch 164.

When the SPD module 200 is installed on the PCB 50 as described above for the SPD module 100 and the PCB 20, the RS connectors 220, 222 are thereby insert into and through the PCB through hole slots 47. The spring contacts 225 of the remote connectors 220 and 222 electrically engage the PCB contacts 48 and 49, respectively, to electrically connect the SPD module 200 to the traces 48A and 49A, as discussed above.

More particularly, the V-shaped spring contacts 225 of the remote connectors 220, 222 slide into the slots 47 and engage the through-hole plated contacts 48, 49 inside the slots 47. In some embodiments, the relaxed width of each contact 225 is greater than the corresponding width of its PCB slot 47 so that the contact sections 225A, 225B of spring contacts 225 are elastically pushed together by the slots 47. As a result, each seated spring contact 225 exerts a persistent engagement force against the through-hole plated contact 48, 49 within which it is received.

Figure 24:
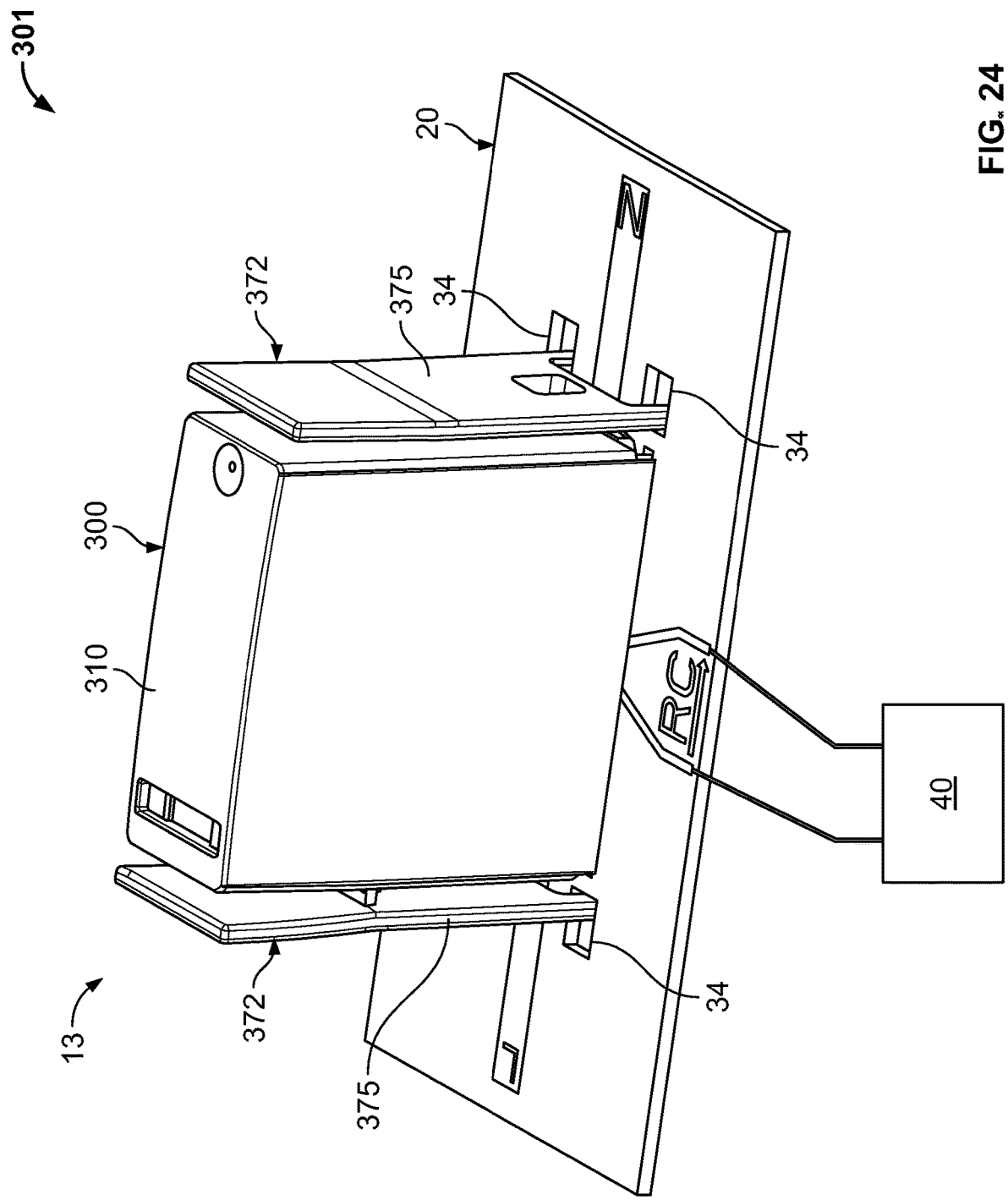
FIG. 24 is a top perspective view of an SPD circuit system according to further embodiments.
Figure 25:
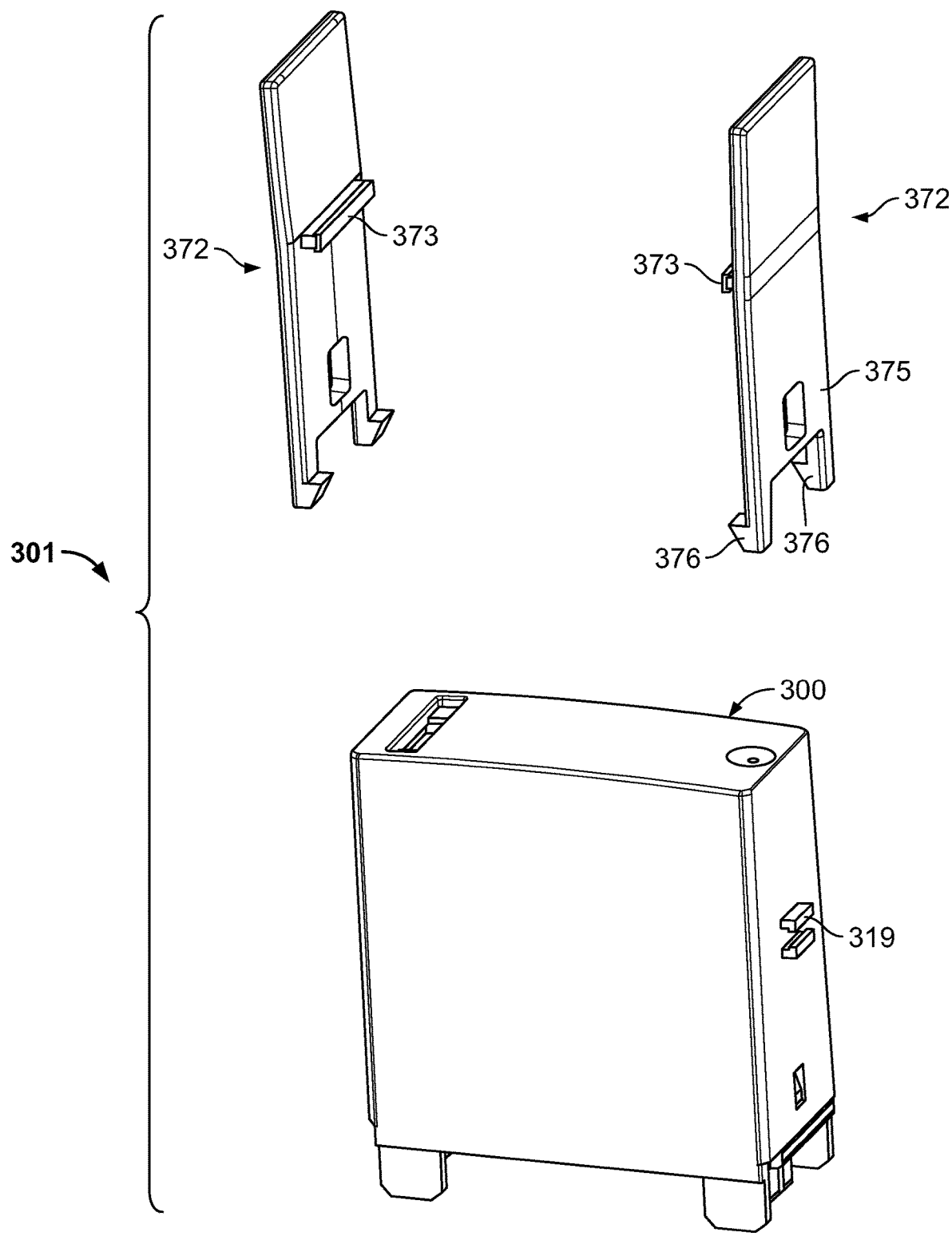
FIG. 25 is an exploded, top perspective view of an SPD module forming a part of the SPD circuit system of FIG. 24.
Figure 26:
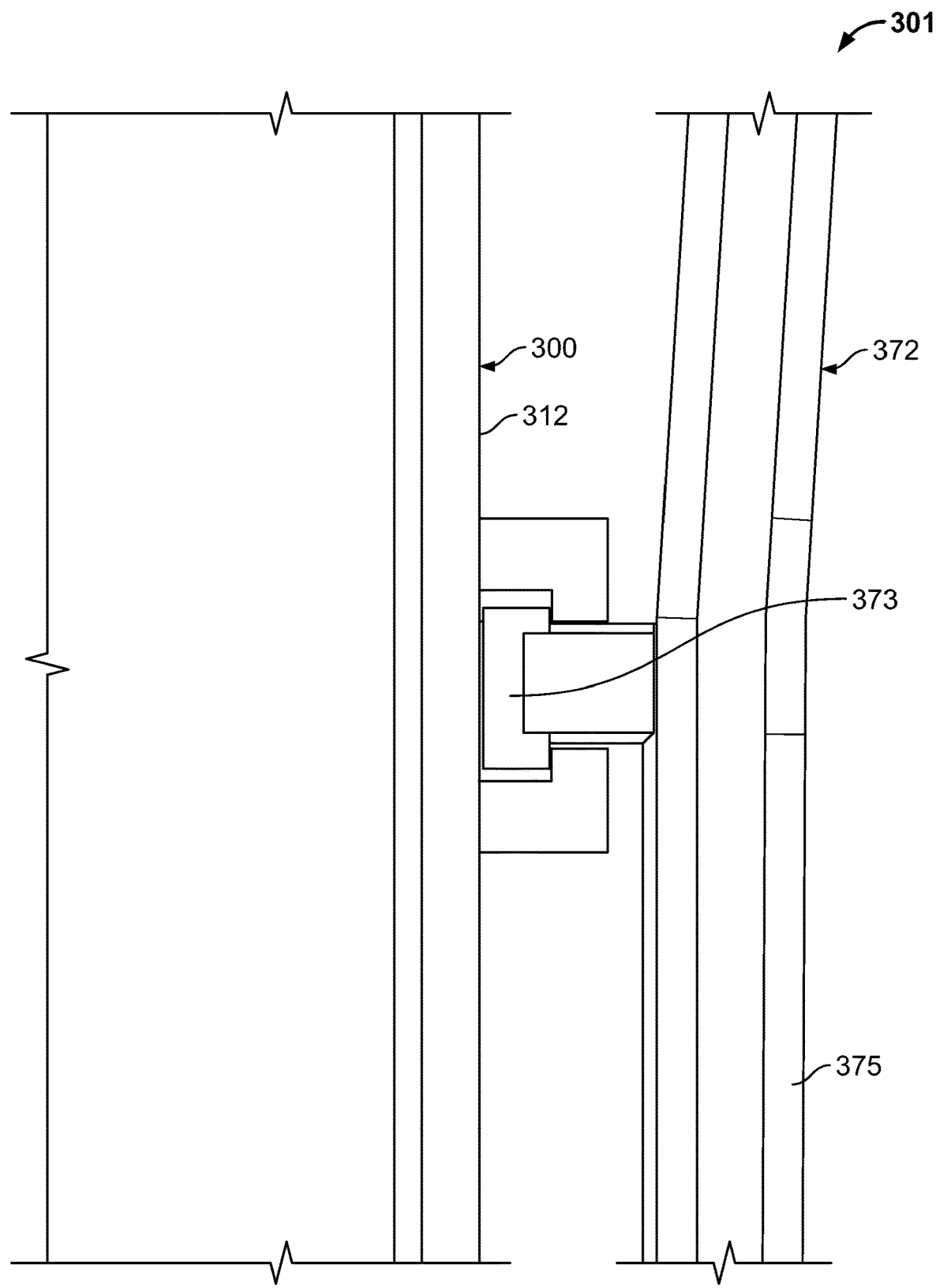
FIG. 26 is a fragmentary, side view of the SPD module of FIG. 25.
Figure 27:
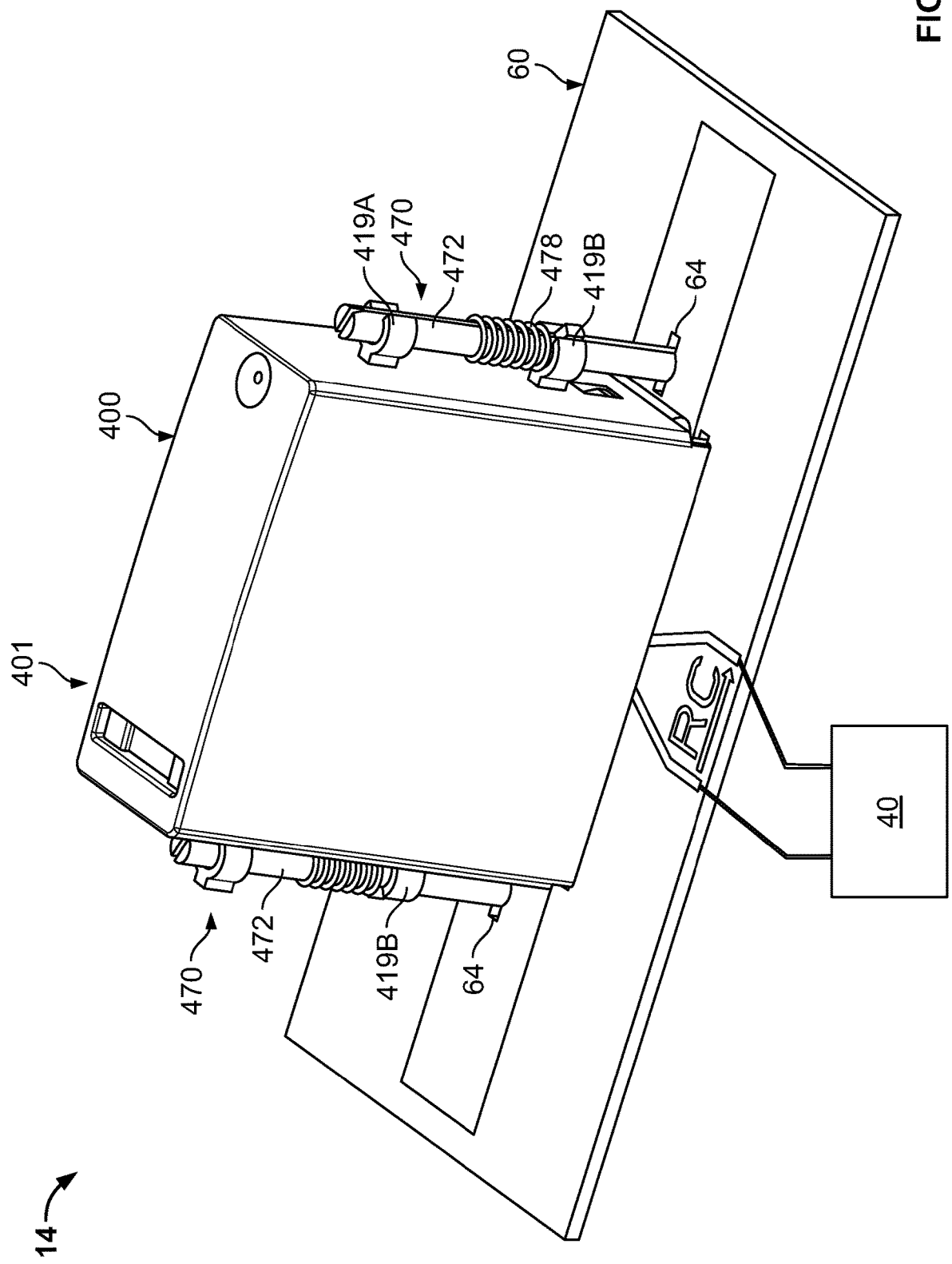
FIG. 27 is a top perspective view of an SPD circuit system according to further embodiments.

With reference to FIGS. 24-26, an SPD circuit network or system 13 according to further embodiments of the inventive concept is shown therein. The system 13 includes a PCB 20, an SPD monitoring system 40, and an SPD module 300 corresponding to the PCB 20, the SPD monitoring system 40, and the SPD module 100, except as follows. The system 13 and the SPD module 300 may be used in the same manner as the system 10 and the SPD module 100, except as discussed below.

The SPD module 300 differs from the SPD module 100 in that the fixed locking tabs 175 of the SPD module 200 are replaced with locking members 372. The SPD module 300 includes a module subassembly 301 that includes all of the components of the SPD module 100 except the locking tabs 175.

Each locking member 372 includes a flexible tab 375 and a pair of latching features 376 corresponding to the latching features 176.

The locking members 372 are separately formed from the module subassembly 301 and the SPD housing 310. The locking members 372 are selectively mountable on the SPD housing 310 using attachment or interlock features 319 (of the housing 310) and attachment or interlock features 373 (of each locking member 372). The locking tabs 375 are flexibly cantilevered from the sidewalls of the cover 312 at the attachment points.

When the module subassembly 301 is inserted onto the PCB 20, the locking tabs 375 are received in the PCB slots 34 and are latched in placed by the latch features 376 as discussed above with regard to the locking tabs 175 and latching features 176.

In some embodiments, a plurality of locking members 372 of different sizes (in some embodiments, different lengths) is provided. An assembler of the SPD module 300 selects and installs on the housing 310 a pair of the locking members 372 having the preferred dimensions for the intended use. In particular, the assembler may select a set of locking members 372 having tabs 375 of an appropriate length for a PCB of a given thickness, and alternatively, select a different set of locking members 372 having tabs 375 having a relatively longer length for a PCB having a greater thickness (or, alternatively, shorter tabs 375 for a PCB having a lesser thickness). In this way, the fit of the SPD module 300 can be customized to the thickness of the PCB 20 on which the SPD module 300 is mounted.

In some embodiments, the locking members 372 of appropriate size (for the intended PCB thickness) are selected from a range of sizes by the manufacturer, and the appropriately sized locking members 372 are paired with the SPD module subassembly 301 as delivered to the customer. In some embodiments, the appropriately sized locking members 372 installed by the manufacturer on the module housing 310, and the preassembled SPD module 300 is supplied to the customer.

In some embodiments, the customer or installer is provided with the SPD module subassembly 301 and a set of locking members 372 of different sizes. The customer or installer selects the appropriately sized locking members 372 from the set, and installs these locking members 372 on the SPD module housing 310.

With reference to FIGS. 27-31, an SPD circuit network or system 14 according to further embodiments of the inventive concept is shown therein. The system 14 includes a PCB 60, an SPD monitoring system 40, and an SPD module 400 corresponding to the PCB 20, the SPD monitoring system 40, and the SPD module 100, except as follows. The system 14 and the SPD module 400 may be used in the same manner as the system 10 and the SPD module 100, except as discussed below.

The SPD module 400 differs from the SPD module 100 in that the fixed locking tabs 175 of the SPD module 100 are replaced with locking mechanisms 470. The SPD module 400 includes an SPD module subassembly 401 that includes all of the components of the SPD module 100 except the locking tabs 175. The PCB 60 has locking slots 64.

Each locking mechanism 470 includes a locking member 472, a biasing mechanism or spring 478, and retainer features 419A, 419B (forming a part of the module housing 410). The locking member 472 is mounted in the retainer features 419A, 419B to permit rotation relative to the housing 410 in either direction about a locking axis E-E.

The locking member 472 includes a body 474 having a front end 474A and a rear end 474B. Radially projecting, integral latch features 476 are located at the rear end 474B. A drive feature 477 is located at the front end 474A and may be configured to engage a driver (e.g., a screwdriver) to force the locking member 472 to rotate about the axis E-E. A spring retainer feature or slot 473 is defined in the body 474. An integral stop feature or tab 475 projects radially outward from the body 474.

When the SPD module 400 is assembled, the body 474 is rotatably held by the retainer features 419A, 419B. The spring 478 is mounted on the body 474 such that a front end of the spring 478 is captured in the spring retainer slot 473 and a rear end of the spring 478 is braced by the rear retainer feature 419B.

Figure 28:
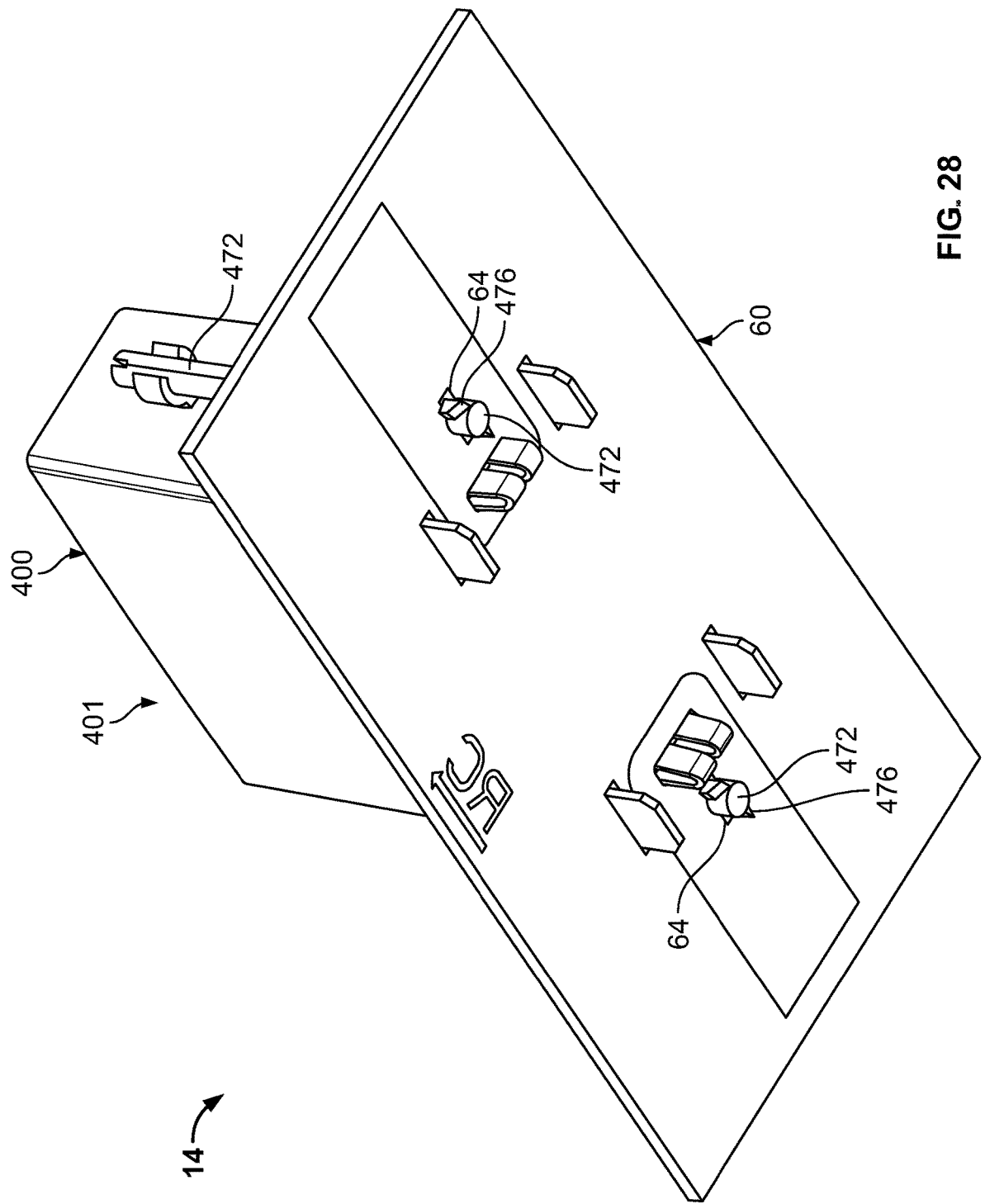
FIG. 28 is a bottom perspective view of the SPD circuit system of FIG. 27.
Figure 29:
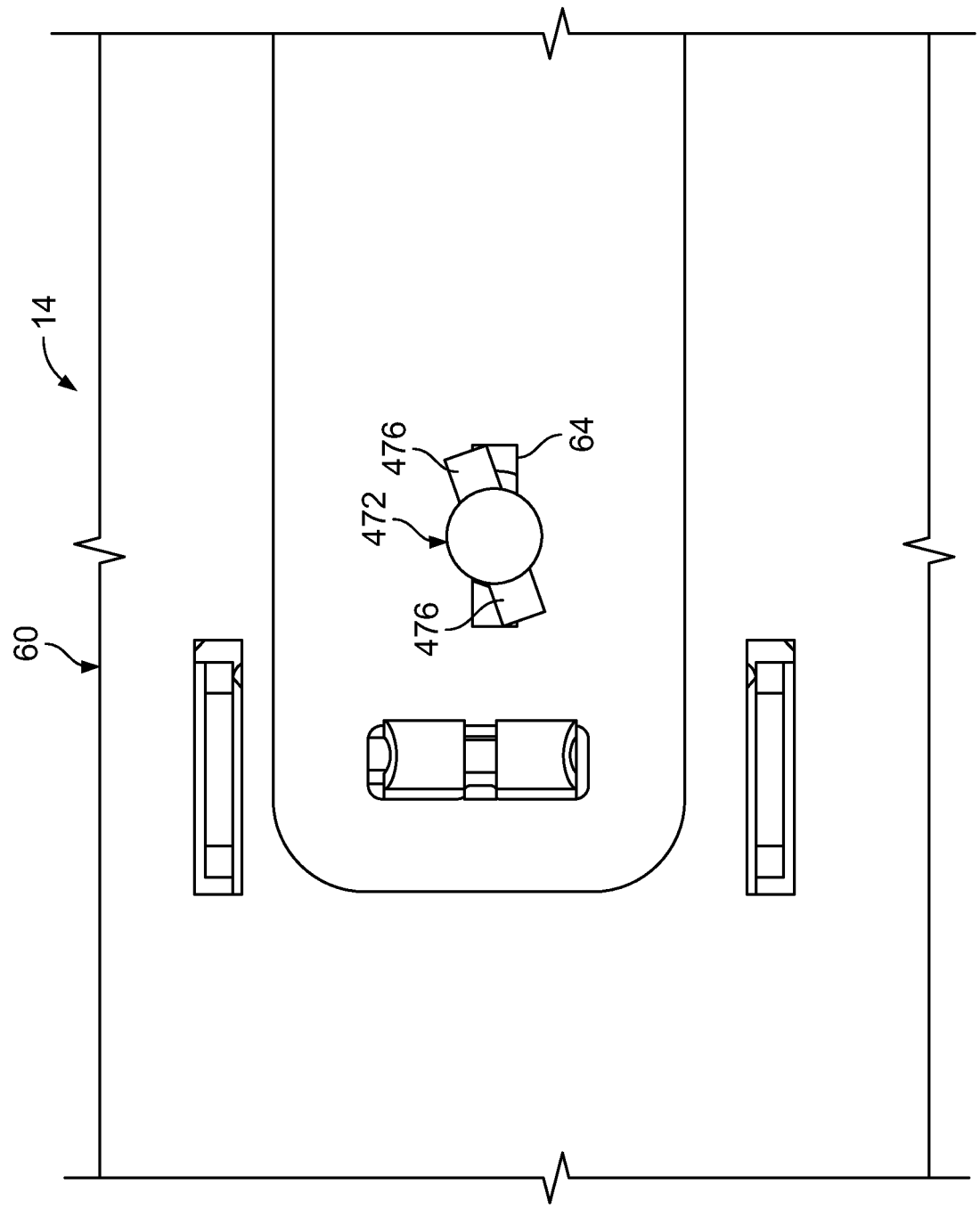
FIG. 29 is a fragmentary, bottom plan view of the SPD circuit system of FIG. 27.
Figure 30:
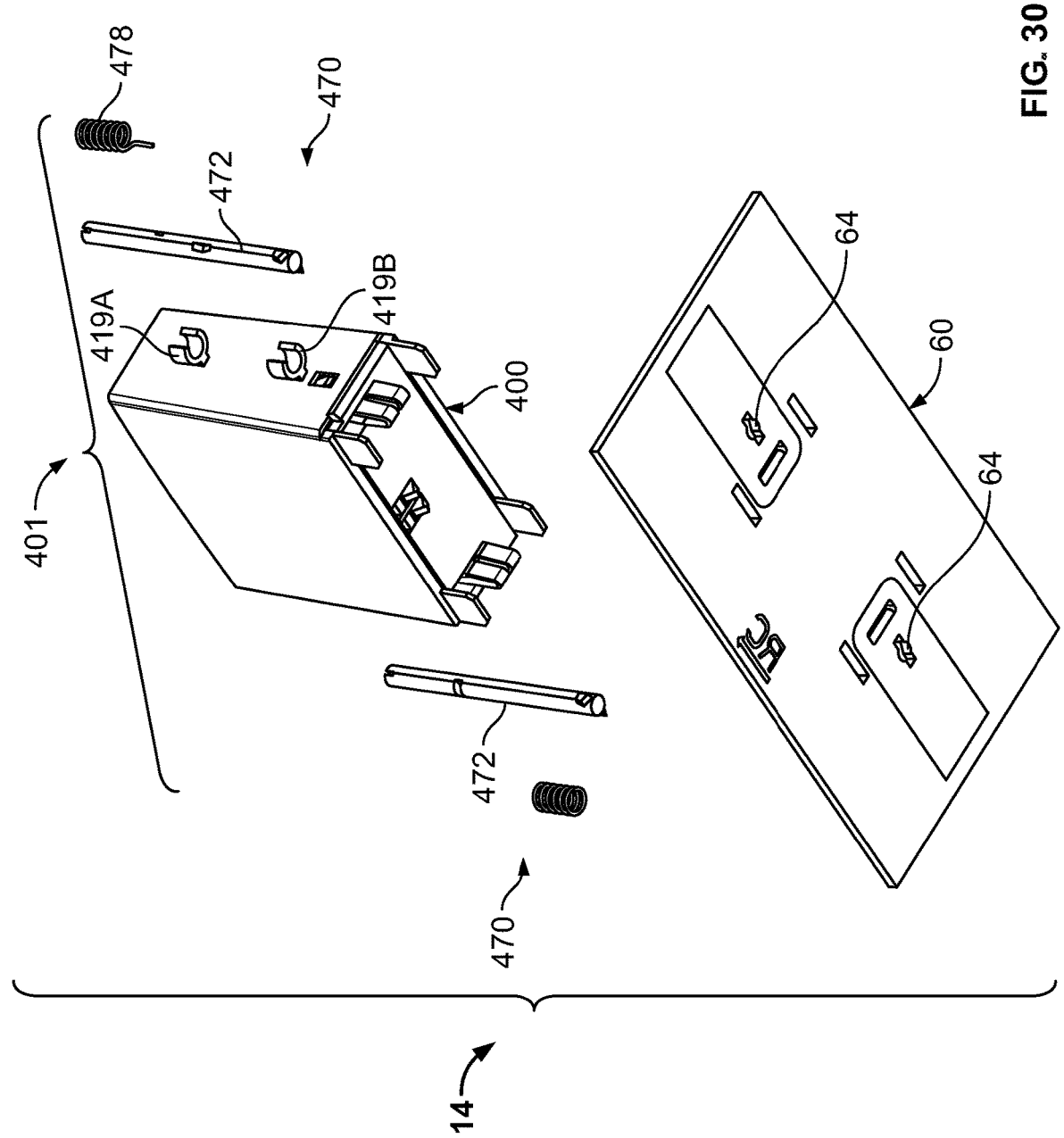
FIG. 30 is an exploded, bottom perspective view of the SPD circuit system of FIG. 27.
Figure 31:
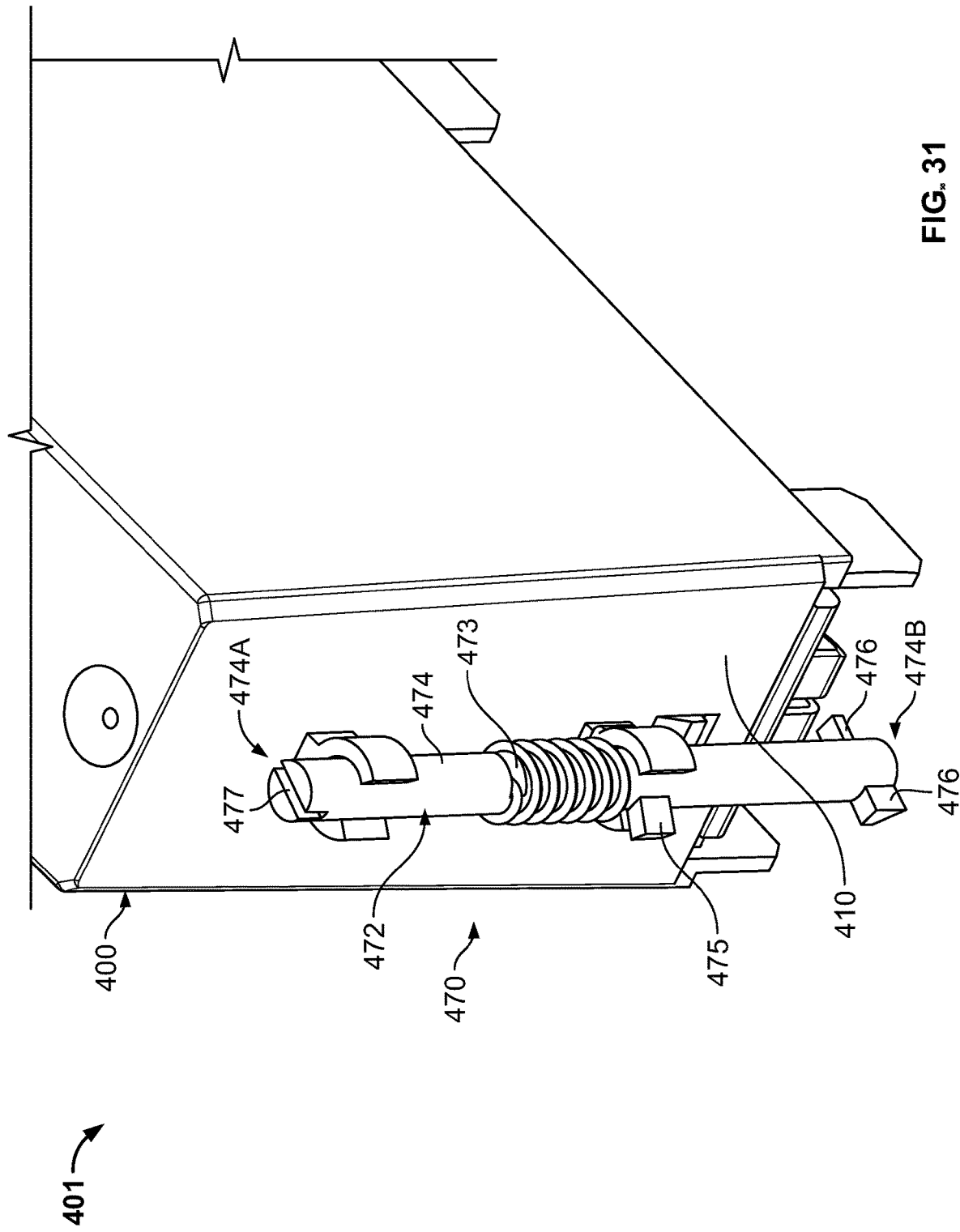
FIG. 31 is a fragmentary, top perspective view of an SPD module forming a part of the SPD circuit system of FIG. 27.

In use, the SPD module 400 is mounted on the PCB 60 as described above. During the step of pushing the SPD module 400 onto the PCB 60 or thereafter, the locking members 472 are rotated to align the latch features 476 with the PCB locking slots 64 and the latch features 476 are inserted through the slots 64. Thereafter, the locking members 472 are rotated to mis-align the latch features 476 with the PCB locking slots 64 as shown in FIGS. 28 and 29. The latch features 476 then serve to prevent the rear ends 474B of the locking members 472 from being withdrawn from the slots 64. The SPD module subassembly 401 is prevented from being removed from the locking members 472 by the spring 478 and the retainer features 419A, 419B. Accordingly, the SPD module 400 is thereby locked onto the PCB 60.

In some embodiments, the spring 478 of each locking mechanism 470 is compressed when the SPD module 400 is mounted and locked onto the PCB 60 by the locking mechanisms 470. As a result, the springs 478 provide a persistent force that loads the SPD module subassembly 401 against the PCB 60.

The spring-loaded locking mechanisms 470 can be configured to accommodate proper fit on a range of different thicknesses of PCBs 60. Depending on the thickness of the PCD 60, the springs 478 will be more or less compressed, but the locking mechanisms 470 and the SPD module subassembly 401 will be nonetheless well-secured to the PCB 60.

The spring-loaded locking mechanisms 470 can also ensure a reliable fit between the SPD module 400 and the PCB 60, including proper engagement between the power connectors 452, 456 and the PCB contacts 46, 47 and between the RS connectors 420, 422 and the PCB remote contacts 48, 49. The springs 478 can accommodate vibration and stresses or applied to the PCB 60 or the module 400.

While SPD modules and systems according to some embodiments have been shown in the figures and described above, other constructions, architectures and functionalities may be provided. The remote signalization circuit may be configured to direct a remote signal from the SPD module via the remote signal connectors (e.g., the connectors 120, 122 or 220, 222) to the remote system (e.g., the SPD monitoring system 40), as described above. Additionally or alternatively, in accordance with some embodiments, the remote signalization circuit may be configured to direct a remote signal from the remote system (e.g., a circuit configured to command an action in the SPD module).

While a switch mechanism 160 is described above, the remote signal circuit integrated within the SPD module may be of another type or configuration. For example, the remote signal circuit within the SPD module (which generates the signal detected by the SPD monitoring system 40) may be a sensor that senses a condition within the module (e.g., a temperature sensor or current sensor). The remote signal circuit within the SPD module may be a solid state switch or sensor.

With reference to FIG. 32, an SPD module 500 according to further embodiments is shown therein. The SPD module 500 is constructed in the same manner as the SPD module 100 and can be used with a PCB 20 in the same manner as the SPD module 100, except as follows.

The SPD module 500 includes release features, buttons, tabs, or levers 577 extending forward from each locking tab 575. In use, the release tabs 577 can be pressed inward (toward the module housing 510) to pivot the locking tabs 575 outward about respective pivot connections 519. In this manner, the latching features 576 can be disengaged with the PCB 20 to remove the SPD module 500 from the PCB 20.

In the description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like reference numbers signify like elements throughout the description of the figures.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive subject matter.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A surge protective device (SPD) circuit system for providing overvoltage protection to an electrical power circuit, the SPD circuit system comprising:
   a printed circuit board (PCB) assembly including:
      a PCB; and
      a remote signal (RS) PCB contact on the PCB;
   an SPD module selectively mountable on the PCB, the SPD module including:
      an overvoltage clamping element; and
      an RS spring contact, the RS spring contact including an RS contact portion; and
   an SPD monitoring system;
   wherein, when the SPD module is mounted on the PCB and the electrical power circuit is connected to the PCB:
      the PCB electrically connects the SPD module to the electrical power circuit and the overvoltage clamping element provides overvoltage protection to the electrical power circuit;
      the RS contact portion engages the RS PCB contact;
      the RS spring contact is elastically deflected and persistently loads the RS contact portion against the RS PCB contact;
      the RS spring contact is electrically connected to the SPD monitoring system via the RS PCB contact; and
   wherein:
      the PCB assembly includes first and second electrical power contacts on the PCB;
      the SPD module includes first and second electrical power terminals;
      the overvoltage clamping element is connected between the first and second electrical power terminals; and
      the first and second electrical power terminals are configured to engage the first and second electrical power contacts, respectively, and thereby electrically connect the first and second electrical power contacts to the overvoltage clamping element.

2. The SPD circuit system of claim 1 wherein:
   the PCB assembly includes a second RS PCB contact on the PCB;
   the SPD module includes a second RS spring contact, the second RS spring contact including a second RS contact portion; and
      when the SPD module is mounted on the PCB and the electrical power circuit is connected to the PCB:
         the second RS contact portion engages the second RS PCB contact;
         the second RS spring contact is elastically deflected and persistently loads the second RS contact portion against the second RS PCB contact; and
         the second RS spring contact is electrically connected to the SPD monitoring system via the second RS PCB contact.

3. The SPD circuit system of claim 1 wherein the RS PCB contact is an electrically conductive contact layer forming a part of the PCB.

4. The SPD circuit system of claim 3 wherein the RS PCB contact is an electrically conductive PCB contact pad forming a part of the PCB.

5. The SPD circuit system of claim 3 wherein the RS PCB contact is an electrically conductive plated through hole forming a part of the PCB.

6. The SPD circuit system of claim 1 wherein the overvoltage clamping element includes a varistor.

7. The SPD circuit system of claim 1 wherein the SPD module includes a module housing enclosing the overvoltage clamping element and supporting the RS spring contact.

8. The SPD circuit system of claim 1 wherein:
   the PCB assembly includes stabilizer slots defined in the substrate; and
   the SPD module includes stabilizer tabs configured to be received in the stabilizer slots when the SPD module is mounted on the PCB.

9. The SPD circuit system of claim 1 including a locking mechanism configured to mechanically and releasably secure the SPD module to the PCB when the SPD module is mounted on the PCB.

10. The SPD circuit system of claim 1 wherein:
    the SPD module includes a module condition indicator mechanism; and
    the SPD monitoring system is configured to detect a state of the module condition indicator mechanism via the RS PCB contact.

11. The SPD circuit system of claim 10 wherein the module condition indicator mechanism includes a switch.

12. The SPD circuit system of claim 10 wherein:
    the module condition indicator mechanism includes a thermal disconnector mechanism; and
    the thermal disconnector mechanism is configured to electrically disconnect the first electrical power terminal from the second electrical power terminal responsive to a thermal event in the SPD module.

13. The SPD circuit system of claim 12 wherein:
    the module condition indicator mechanism includes a switch; and
    the thermal disconnector mechanism is configured to change a state of the switch responsive to a thermal event in the SPD module.

14. The SPD circuit system of claim 13 wherein:
    the SPD module includes a local alert mechanism; and
    the thermal disconnector mechanism is configured to actuate the local alert mechanism responsive to a thermal event in the SPD module.

15. The SPD circuit system of claim 1 wherein the SPD monitoring system is configured to issue an alarm responsive to the SPD monitoring system detecting a failure of the SPD module via the RS PCB contact.

16. The SPD circuit system of claim 1 wherein:
    the PCB assembly includes a second RS PCB contact on the PCB;
    the SPD module includes a second RS spring contact, the second RS spring contact including a second RS contact portion;
       when the SPD module is mounted on the PCB and the electrical power circuit is connected to the PCB:
          the second RS contact portion engages the second RS PCB contact;
          the second RS spring contact is elastically deflected and persistently loads the second RS contact portion against the second RS PCB contact; and
          the second RS spring contact is electrically connected to the SPD monitoring system via the second RS PCB contact;

the overvoltage clamping element includes a varistor;
the SPD module includes a module condition indicator mechanism;
the SPD monitoring system is configured to detect a state of the module condition indicator mechanism via the RS PCB contact;
the module condition indicator mechanism includes a thermal disconnector mechanism;
the thermal disconnector mechanism is configured to electrically disconnect the first electrical power terminal from the second electrical power terminal responsive to a thermal event in the SPD module;
the SPD module includes a module housing enclosing the overvoltage clamping element and the thermal disconnector mechanism, and supporting the RS spring contact; and
the SPD circuit system includes a locking mechanism configured to mechanically and releasably secure the SPD module to the PCB when the SPD module is mounted on the PCB.

17. A method for providing overvoltage protection to an electrical power circuit, the method comprising:
providing a surge protective device (SPD) circuit system including:
a printed circuit board (PCB) assembly including:
a PCB;
first and second electrical power contacts on the PCB; and
a remote signal (RS) PCB contact on the PCB;
an SPD module selectively mountable on the PCB, the SPD module including:
an overvoltage clamping element;
first and second electrical power terminals; and
an RS spring contact, the RS spring contact including an RS contact portion; and
an SPD monitoring system electrically connected to the RS PCB contact;
wherein:
the overvoltage clamping element is connected between the first and second electrical power terminals; and
the first and second electrical power terminals are configured to engage the first and second electrical power contacts, respectively;
mounting the SPD module on the PCB;
connecting the electrical power circuit to the PCB;
wherein, when the SPD module is mounted on the PCB and the electrical power circuit is connected to the PCB:
the PCB electrically connects the SPD module to the electrical power circuit and the overvoltage clamping element provides overvoltage protection to the electrical power circuit;
the RS contact portion engages the RS PCB contact;
the RS spring contact is elastically deflected and persistently loads the RS contact portion against the RS PCB contact;
the RS spring contact is electrically connected to the SPD monitoring system via the RS PCB contact; and
the first and second electrical power terminals engage the first and second electrical power contacts, respectively, and thereby electrically connect the first and second electrical power contacts to the overvoltage clamping element.

18. A surge protective device (SPD) module for use with a printed circuit board (PCB) assembly and an SPD monitoring system for providing overvoltage protection to an electrical power circuit, the PCB assembly including a PCB, first and second electrical power contacts on the PCB on the PCB, and a remote signal (RS) PCB contact on the PCB, the SPD module comprising:
an overvoltage clamping element;
first and second electrical power terminals; and
an RS spring contact, the RS spring contact including an RS contact portion;
wherein:
the overvoltage clamping element is connected between the first and second electrical power terminals; and
the first and second electrical power terminals are configured to engage the first and second electrical power contacts, respectively;
wherein the SPD module is selectively mountable on the PCB such that:
the RS contact portion engages the RS PCB contact;
the RS spring contact is elastically deflected and persistently loads the RS contact portion against the RS PCB contact;
the RS spring contact is electrically connected to the SPD monitoring system via the RS PCB contact; and
the first and second electrical power terminals engage the first and second electrical power contacts, respectively, and thereby electrically connect the first and second electrical power contacts to the overvoltage clamping element.

19. A surge protective device (SPD) circuit system for providing overvoltage protection to an electrical power circuit, the SPD circuit system comprising:
a printed circuit board (PCB) assembly including:
a PCB; and
a remote signal (RS) PCB contact on the PCB;
an SPD module selectively mountable on the PCB, the SPD module including:
an overvoltage clamping element; and
an RS spring contact, the RS spring contact including an RS contact portion; and
an SPD monitoring system;
wherein, when the SPD module is mounted on the PCB and the electrical power circuit is connected to the PCB:
the PCB electrically connects the SPD module to the electrical power circuit and the overvoltage clamping element provides overvoltage protection to the electrical power circuit;
the RS contact portion engages the RS PCB contact;
the RS spring contact is elastically deflected and persistently loads the RS contact portion against the RS PCB contact; and
the RS spring contact is electrically connected to the SPD monitoring system via the RS PCB contact; and
wherein:
the PCB assembly includes a second RS PCB contact on the PCB;
the SPD module includes a second RS spring contact, the second RS spring contact including a second RS contact portion; and
when the SPD module is mounted on the PCB and the electrical power circuit is connected to the PCB:
the second RS contact portion engages the second RS PCB contact;
the second RS spring contact is elastically deflected and persistently loads the second RS contact portion against the second RS PCB contact; and the second RS spring contact is electrically connected to the SPD monitoring system via the second RS PCB contact.

20. A surge protective device (SPD) circuit system for providing overvoltage protection to an electrical power circuit, the SPD circuit system comprising:
a printed circuit board (PCB) assembly including:
a PCB; and
a remote signal (RS) PCB contact on the PCB;
an SPD module selectively mountable on the PCB, the SPD module including:
an overvoltage clamping element; and
an RS spring contact, the RS spring contact including an RS contact portion; and
an SPD monitoring system;
wherein, when the SPD module is mounted on the PCB and the electrical power circuit is connected to the PCB:
the PCB electrically connects the SPD module to the electrical power circuit and the overvoltage clamping element provides overvoltage protection to the electrical power circuit;
the RS contact portion engages the RS PCB contact;
the RS spring contact is elastically deflected and persistently loads the RS contact portion against the RS PCB contact; and
the RS spring contact is electrically connected to the SPD monitoring system via the RS PCB contact;
wherein the RS PCB contact is an electrically conductive contact layer forming a part of the PCB;
wherein the RS PCB contact is an electrically conductive PCB contact pad forming a part of the PCB; and
wherein the RS PCB contact is an electrically conductive plated through hole forming a part of the PCB.

21. A surge protective device (SPD) circuit system for providing overvoltage protection to an electrical power circuit, the SPD circuit system comprising:
a printed circuit board (PCB) assembly including:
a PCB; and
a remote signal (RS) PCB contact on the PCB;
an SPD module selectively mountable on the PCB, the SPD module including:
an overvoltage clamping element; and
an RS spring contact, the RS spring contact including an RS contact portion; and
an SPD monitoring system;
wherein, when the SPD module is mounted on the PCB and the electrical power circuit is connected to the PCB:
the PCB electrically connects the SPD module to the electrical power circuit and the overvoltage clamping element provides overvoltage protection to the electrical power circuit;
the RS contact portion engages the RS PCB contact;
the RS spring contact is elastically deflected and persistently loads the RS contact portion against the RS PCB contact; and
the RS spring contact is electrically connected to the SPD monitoring system via the RS PCB contact; and
wherein:
the PCB assembly includes stabilizer slots defined in the substrate; and
the SPD module includes stabilizer tabs configured to be received in the stabilizer slots when the SPD module is mounted on the PCB.

22. A surge protective device (SPD) circuit system for providing overvoltage protection to an electrical power circuit, the SPD circuit system comprising:
a printed circuit board (PCB) assembly including:
a PCB; and
a remote signal (RS) PCB contact on the PCB;
an SPD module selectively mountable on the PCB, the SPD module including:
an overvoltage clamping element; and
an RS spring contact, the RS spring contact including an RS contact portion; and
an SPD monitoring system;
wherein, when the SPD module is mounted on the PCB and the electrical power circuit is connected to the PCB:
the PCB electrically connects the SPD module to the electrical power circuit and the overvoltage clamping element provides overvoltage protection to the electrical power circuit;
the RS contact portion engages the RS PCB contact;
the RS spring contact is elastically deflected and persistently loads the RS contact portion against the RS PCB contact; and
the RS spring contact is electrically connected to the SPD monitoring system via the RS PCB contact; and
wherein the SPD circuit system includes a locking mechanism configured to mechanically and releasably secure the SPD module to the PCB when the SPD module is mounted on the PCB.

23. The SPD circuit system of claim 22 wherein the locking mechanism includes:
a locking slot defined in the substrate; and
a displaceable locking tab forming a part of the SPD module;
wherein the locking tab is configured to interlock with the locking slot when the SPD module is mounted on the PCB to secure the SPD module to the PCB.

24. The SPD circuit system of claim 23 wherein the SPD module includes:
a module housing enclosing the overvoltage clamping element and supporting the RS spring contact; and
a locking member including the locking tab and removably coupled to the module housing.

25. The SPD circuit system of claim 23 wherein the SPD module includes a release mechanism operable to release the locking tab from the locking slot.

26. The SPD circuit system of claim 22 wherein the locking mechanism includes:
a locking slot defined in the substrate; and
a locking member forming a part of the SPD module, the locking member including a latch feature;
wherein the locking member is rotatable between a locked position, to interlock the latch feature with the locking slot, and an unlocked position, to release the latch feature from the locking slot, when the SPD module is mounted on the PCB.

* * * * *

UNITED STATES PATENT AND TRADEMARK OFFICE
CERTIFICATE OF CORRECTION

PATENT NO. : 11,723,145 B2
APPLICATION NO. : 17/479356
DATED : August 8, 2023
INVENTOR(S) : Žniderič et al.

Page 1 of 1

It is certified that error appears in the above-identified patent and that said Letters Patent is hereby corrected as shown below:

On the Title Page

(56) References Cited, U.S. PATENT DOCUMENTS, Page 2, Column 2, Line 30: Please correct "Kepapas et al." to read --Xepapas et al.--

Signed and Sealed this
Twenty-sixth Day of September, 2023

Katherine Kelly Vidal
*Director of the United States Patent and Trademark Office*